(12) United States Patent
Shin

(10) Patent No.: US 10,319,741 B2
(45) Date of Patent: Jun. 11, 2019

(54) SEMICONDUCTOR DEVICES

(71) Applicant: SAMSUNG ELECTRONICS CO., LTD., Suwon-si, Gyeonggi-do (KR)

(72) Inventor: Wangho Shin, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/665,562

(22) Filed: Aug. 1, 2017

(65) Prior Publication Data

US 2018/0166345 A1 Jun. 14, 2018

(30) Foreign Application Priority Data

Dec. 14, 2016 (KR) .................. 10-2016-0170556

(51) Int. Cl.

| H01L 27/11597 | (2017.01) |
|---|---|
| H01L 21/8234 | (2006.01) |
| H01L 27/108 | (2006.01) |
| H01L 21/308 | (2006.01) |
| H01L 21/306 | (2006.01) |

(Continued)

(52) U.S. Cl.
CPC .... *H01L 27/11597* (2013.01); *H01L 21/3083* (2013.01); *H01L 21/30625* (2013.01); *H01L 21/67173* (2013.01); *H01L 21/67346* (2013.01); *H01L 21/762* (2013.01); *H01L 21/823487* (2013.01); *H01L 27/10891* (2013.01); *H01L 27/1158* (2013.01); *H01L 27/11514* (2013.01); *H01L 27/11551* (2013.01); *H01L 27/11553* (2013.01); *H01L 27/11565* (2013.01); *H01L 27/11578* (2013.01); *H01L 27/11582* (2013.01); *H01L 27/281* (2013.01)

(58) Field of Classification Search
CPC ......... H01L 27/11551; H01L 27/11553; H01L 27/1158; H01L 27/11578; H01L 27/11514; H01L 27/11597; H01L 27/281
See application file for complete search history.

(56) References Cited

U.S. PATENT DOCUMENTS 7,776,750 B2 8/2010 Kim
8,216,948 B2 7/2012 Moon
(Continued)

FOREIGN PATENT DOCUMENTS

| JP | 6028516 B2 | 11/2016 |
|---|---|---|
| KR | 10-2010-0059512 A | 6/2010 |
| KR | 10-2013-0022677 A | 3/2013 |

*Primary Examiner* — Feifei Yeung Lopez
(74) *Attorney, Agent, or Firm* — Lee & Morse, P.C.

(57) ABSTRACT

A semiconductor device includes first and second select lines, first and second vertical pillars, and first and second subsidiary lines. The select lines are spaced apart and include a first separating insulation layer therebetween. Each of the first and second vertical pillars is connected to a corresponding one of the first or second select lines. The first vertical pillars are closer to the first separating insulation layer. The second vertical pillars arranged in an oblique direction from the first vertical pillars. Each of the first subsidiary lines connects a pair of the first vertical pillars. Each of the second subsidiary lines connects a pair of the second vertical pillars adjacent. The first and second subsidiary lines are alternately disposed along a first direction, and ends of the first and second subsidiary lines are aligned along the first direction.

13 Claims, 36 Drawing Sheets

(51) Int. Cl.
  *H01L 21/67*    (2006.01)
  *H01L 21/673*   (2006.01)
  *H01L 27/11578* (2017.01)
  *H01L 27/11514* (2017.01)
  *H01L 27/28*    (2006.01)
  *H01L 27/11553* (2017.01)
  *H01L 27/1158*  (2017.01)
  *H01L 27/11551* (2017.01)
  *H01L 21/762*   (2006.01)
  *H01L 27/11565* (2017.01)
  *H01L 27/11582* (2017.01)

(56) References Cited

U.S. PATENT DOCUMENTS

| | | |
|---|---|---|
| 8,247,904 B2 | 8/2012 | Bangsaruntip et al. |
| 8,575,020 B2 | 11/2013 | Blatchford |
| 9,336,344 B2 | 5/2016 | Smayling et al. |
| 2012/0171865 A1 | 7/2012 | Yoo |
| 2014/0063890 A1* | 3/2014 | Lee ............... H01L 27/11519 365/63 |
| 2014/0097484 A1* | 4/2014 | Seol ............... H01L 29/42332 257/324 |
| 2014/0285789 A1 | 9/2014 | Lu et al. |
| 2015/0060992 A1* | 3/2015 | Taekyung ........ H01L 29/7926 257/324 |
| 2016/0035628 A1 | 2/2016 | Tsujita et al. |

\* cited by examiner

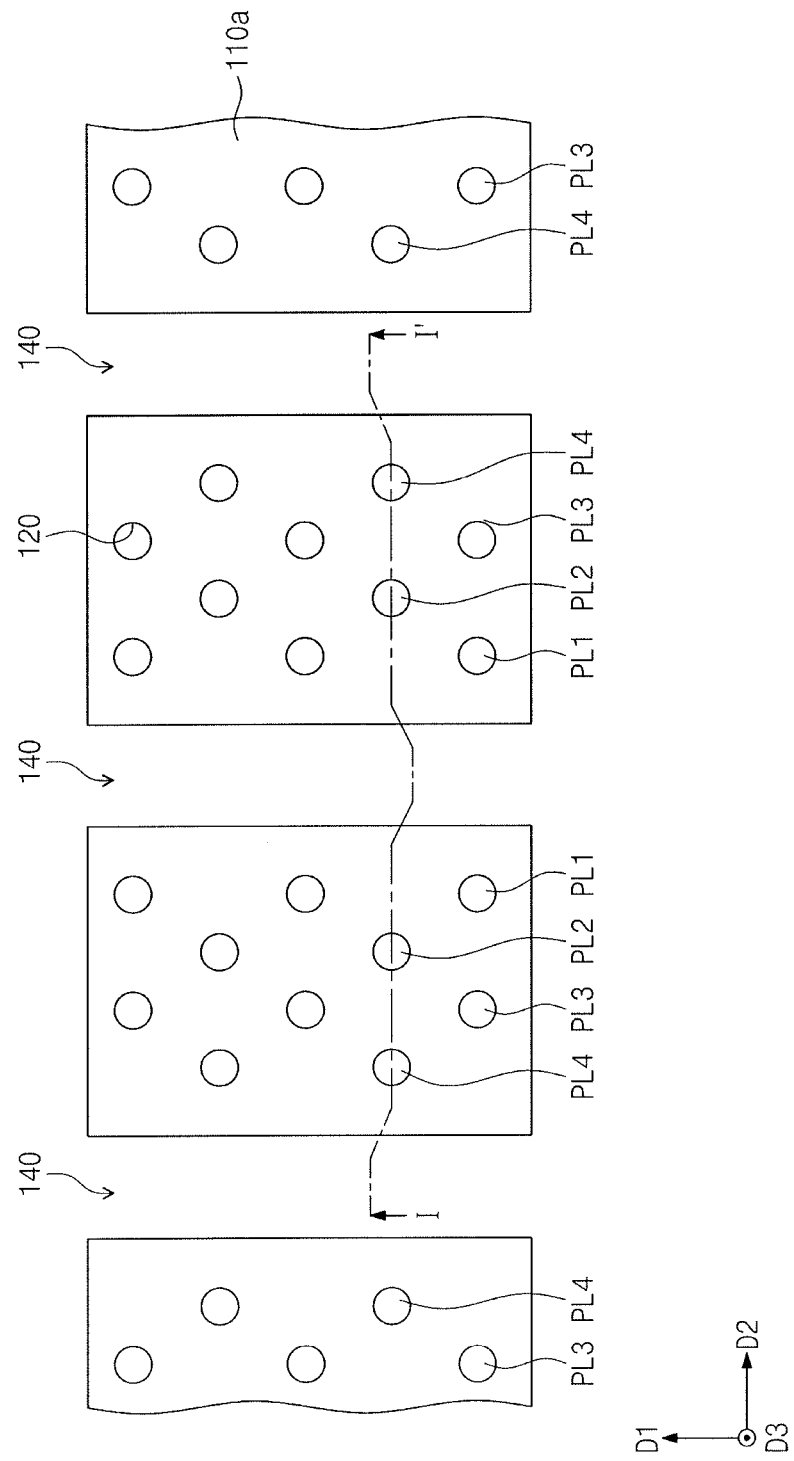

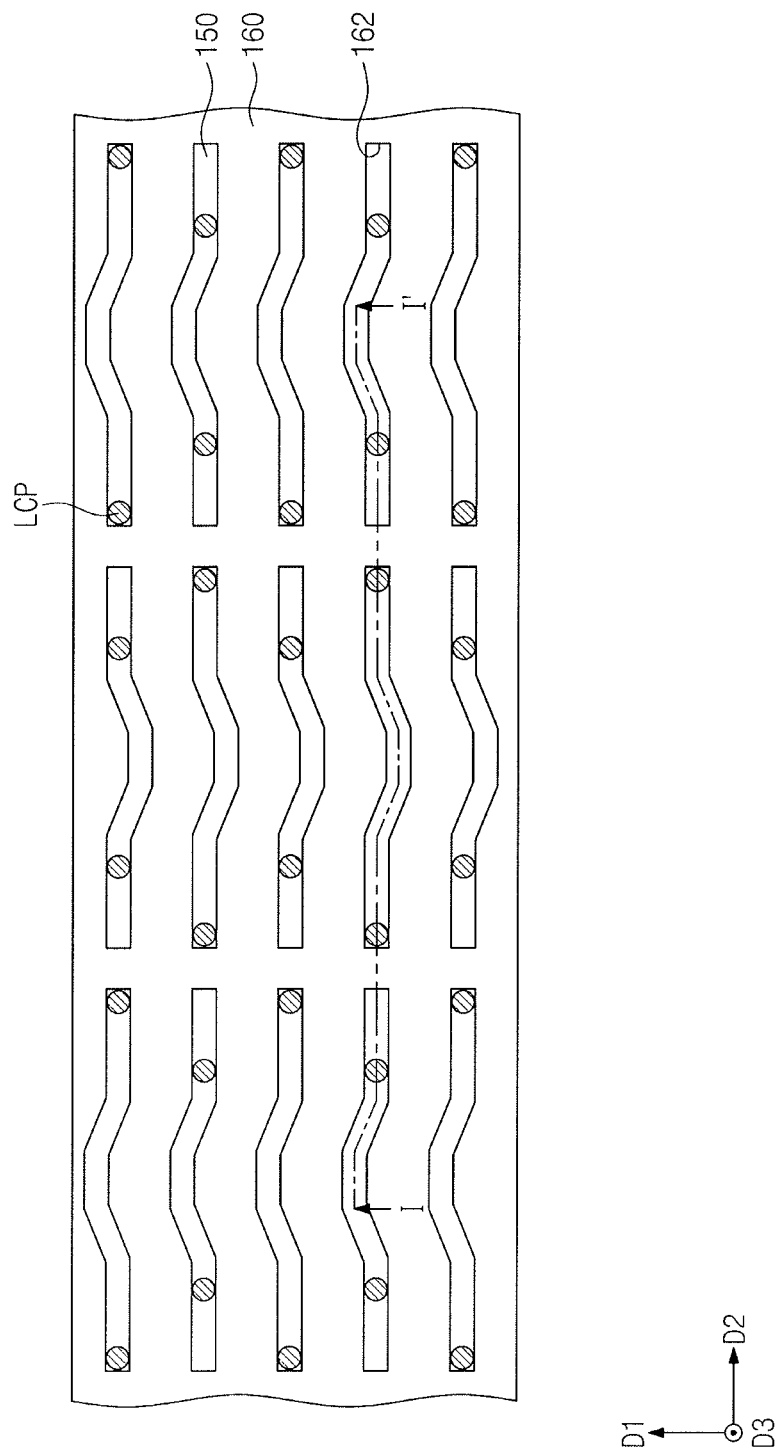

10,319,741 B2

SEMICONDUCTOR DEVICES

CROSS-REFERENCE TO RELATED APPLICATION

Korean Patent Application No. 10-2016-0170556, filed on Dec. 14, 2016, and entitled: "Semiconductor Devices," is incorporated by reference herein in its entirety.

BACKGROUND

1. Field

One or more embodiments described herein relate to a semiconductor device.

2. Description of the Related Art

Integration is a factor in determining the price of semiconductor devices. In order to reduce costs and meet consumer demand for more sophisticated applications, attempts are being made to increase integration.

Integration of two-dimensional (or planar) semiconductor memory devices is primarily determined by the area occupied by the unit memory cells. The size of the memory unit cell area is influenced by the size of fine patterns relating to those cells. However, expensive processing equipment must be used to increase pattern fineness. Another approach to increasing integration involves forming three-dimensional memory cell arrangements. These arrangements also have drawbacks.

SUMMARY

In accordance with one or more embodiments, a semiconductor device includes first and second select lines extending in a first direction on a substrate and spaced apart from each other in a second direction crossing the first direction, with a first separating insulation layer therebetween; a plurality of first and second vertical pillars, each of the first and second vertical pillars connected to a corresponding one of the first or second select lines, the first vertical pillars closer to the first separating insulation layer and the second vertical pillars arranged in an oblique direction from the first vertical pillars; first subsidiary lines, each of the first subsidiary lines electrically connecting a pair of the first vertical pillars adjacent to each other in the second direction; and second subsidiary lines, each of the second subsidiary lines electrically connecting a pair of the second vertical pillars adjacent to each other in the second direction, wherein the first and second subsidiary lines are alternately disposed along the first direction and wherein each of the first and second ends of the first and second subsidiary lines are aligned along the first direction.

In accordance with one or more other embodiments, a semiconductor device includes select lines extending in a first direction and disposed along a second direction crossing the first direction on a substrate; a plurality of vertical pillars, each of the vertical pillars connected to a corresponding one of the select lines and arranged in a zigzag pattern along the first and second directions; and subsidiary lines, each of the subsidiary lines connecting a pair of the vertical pillars respectively coupled to the select lines different from each other and disposed adjacent to each other in the second direction, wherein the subsidiary lines include: first subsidiary lines having a first length and arranged at a first pitch along the first direction; and second subsidiary lines spaced apart from the first subsidiary lines at a first distance in the second direction and having a second distance, and wherein the first distance is less than the first pitch.

In accordance with one or more other embodiments, a semiconductor device includes first and second select lines; first pillars connected to the first select lines; second pillars connected to the second select lines; insulation layers between the first and second select lines; first subsidiary lines connecting respective pairs of adjacent first pillars; second subsidiary lines connecting respective pairs of adjacent second pillars, wherein the first and second subsidiary lines are alternately arranged and wherein ends of each of the first and second subsidiary lines are aligned in a same direction.

BRIEF DESCRIPTION OF THE DRAWINGS

Features will become apparent to those of skill in the art by describing in detail exemplary embodiments with reference to the attached drawings in which:

FIGS. 10A to 15A illustrate various stages corresponding to an embodiment of a method for fabricating a semiconductor device;

FIGS. 10B to 15B illustrate cross-sectional views taken along line I-I' in FIGS. 10A to 15A, respectively;

FIGS. 16A to 20A illustrate various stages corresponding to an embodiment of method for forming subsidiary lines of a semiconductor device;

FIGS. 16B to 20B illustrate partial cross-sectional views taken along line I-I' of FIGS. 16A to 20A, respectively;

DETAILED DESCRIPTION

Figure 1:
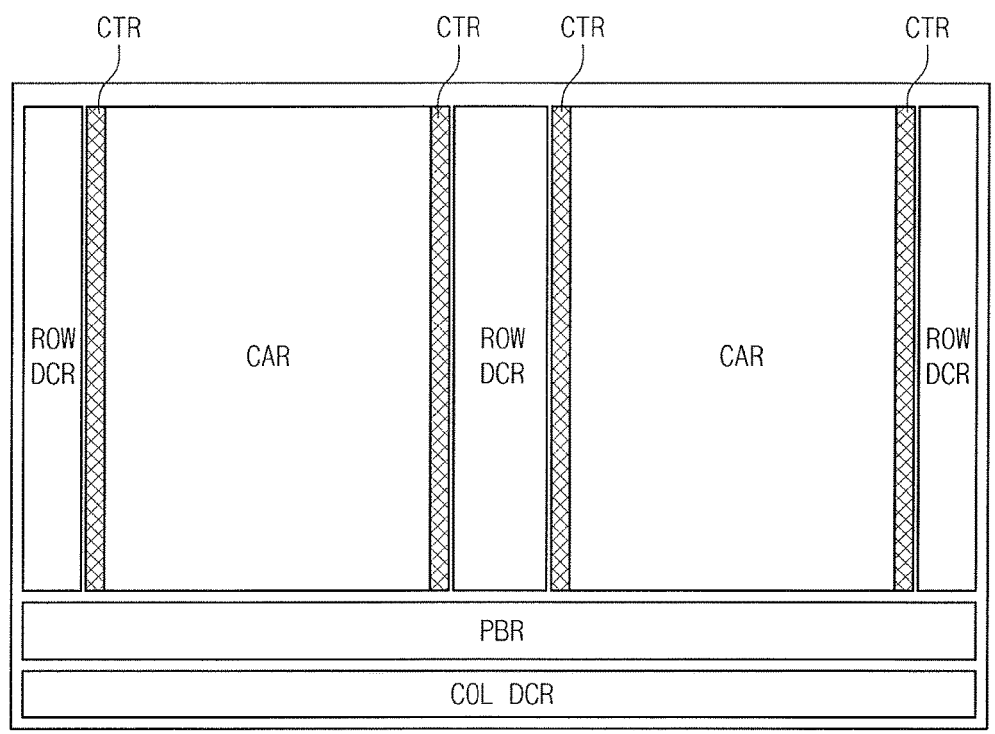
FIG. 1 illustrates an embodiment of a semiconductor device.

FIG. 1 illustrates an embodiment of a semiconductor device which may include a cell array region CAR and a peripheral circuit region. The peripheral circuit region may include row decoder regions ROW DCR, a page buffer region PBR, a column decoder region COL DCR, and a control circuit region. In some embodiments, contact regions CTR may exist between the cell array region CAR and the row decoder regions ROW DCR.

The cell array region CAR may include a memory cell array including a plurality of memory cells. The memory cell array may include a plurality of memory cells arranged in a three-dimensional pattern, a plurality of word lines electrically connected to the memory cells, and a plurality of bit lines electrically connected to the memory cells.

The row decoder region ROW DCR may include a row decoder that selects the word lines of the memory cell array. The contact region CTR may have a routing structure that electrically connects the memory cell array and the row decoder to each other. The row decoder may select one of the word lines of the memory cell array in accordance with address information. The row decoder may provide word line voltages to the selected word line and unselected word lines based on a control signal from a control circuit.

The page buffer region PBR may include a page buffer that reads data stored in the memory cells. Depending on an operating mode, the page buffer may temporarily store data to be stored in the memory cells or sense data stored in the memory cells. The page buffer may function as a write driver in a program operating mode and as a sense amplifier in a read operating mode.

The column decoder region COL DCR may include a column decoder connected to bit lines of the memory cell array. The column decoder may provide a data transmission path between the page buffer and an external device (e.g., a memory controller).

Figure 2:
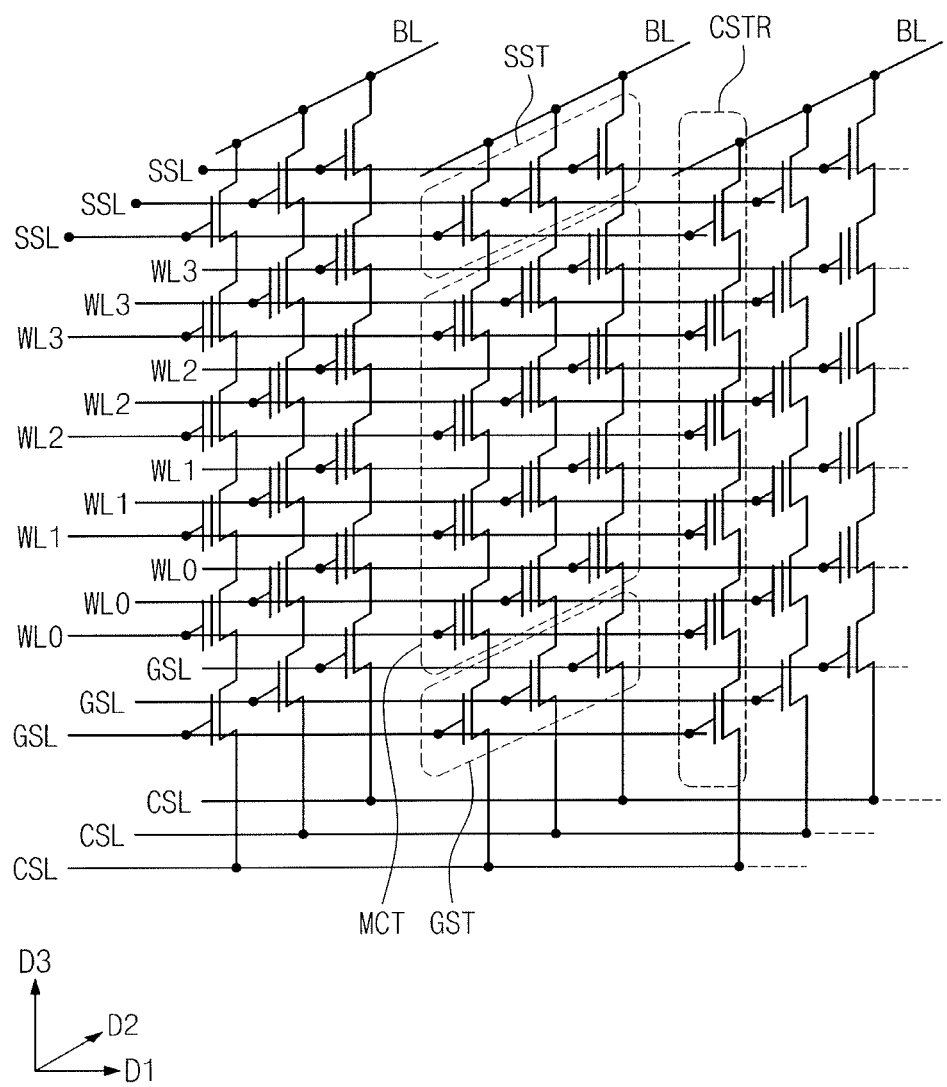
FIG. 2 illustrates an embodiment of a memory cell array.

FIG. 2 illustrates an embodiment of a cell array, which, for example, may be included in the semiconductor device of FIG. 1. Referring to FIG. 2, the memory cell array may include a common source line CSL, a plurality of bit lines BL, and a plurality of cell strings CSTR between the common source line CSL and the bit lines BL.

The bit lines BL may be arranged in a two-dimensional pattern, and a plurality of cell strings CSTR may be connected in parallel to each of the bit lines BL. The cell strings CSTR may be connected in common to the common source line CSL. For example, a plurality of the cell strings CSTR may be between a plurality of the bit lines BL and one common source line CSL. In one embodiment, a plurality of common source lines CSL may be arranged in a two-dimensional pattern. The common source lines CSL may be supplied with the same voltage or may be electrically controlled independently of each other.

Each cell string CSTR may include a ground select transistor GST coupled to the common source line CSL, a string select transistor SST coupled to the bit line BL, and a plurality of memory cell transistors MCT between the ground and string select transistors GST and SST. The ground select transistor GST, the string select transistor SST, and the memory cell transistors MCT may be connected in series.

The common source line CSL may be connected in common to sources of the ground select transistors GST. In addition, a ground select line GSL, a plurality of word lines WL0 to WL3, and a plurality of string select lines SSL between the common source line CSL and the bit lines BL may be used as gate electrodes of the ground select transistor GST, the memory cell transistors MCT, and the string select transistor SST, respectively. Each memory cell transistor MCT may include a data storage element.

Figure 3:
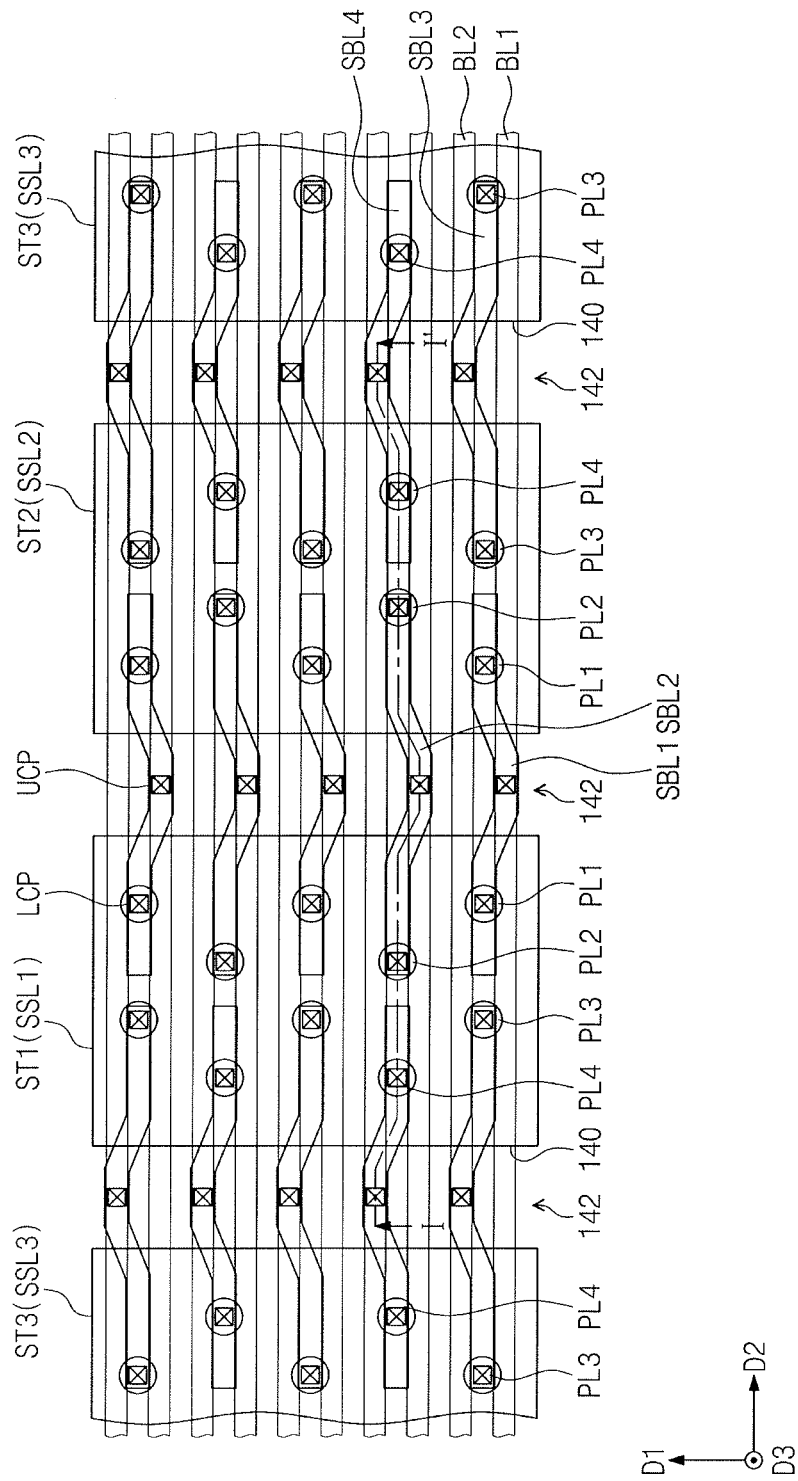
FIG. 3 illustrates a more detailed embodiment of the semiconductor device.
Figure 4:
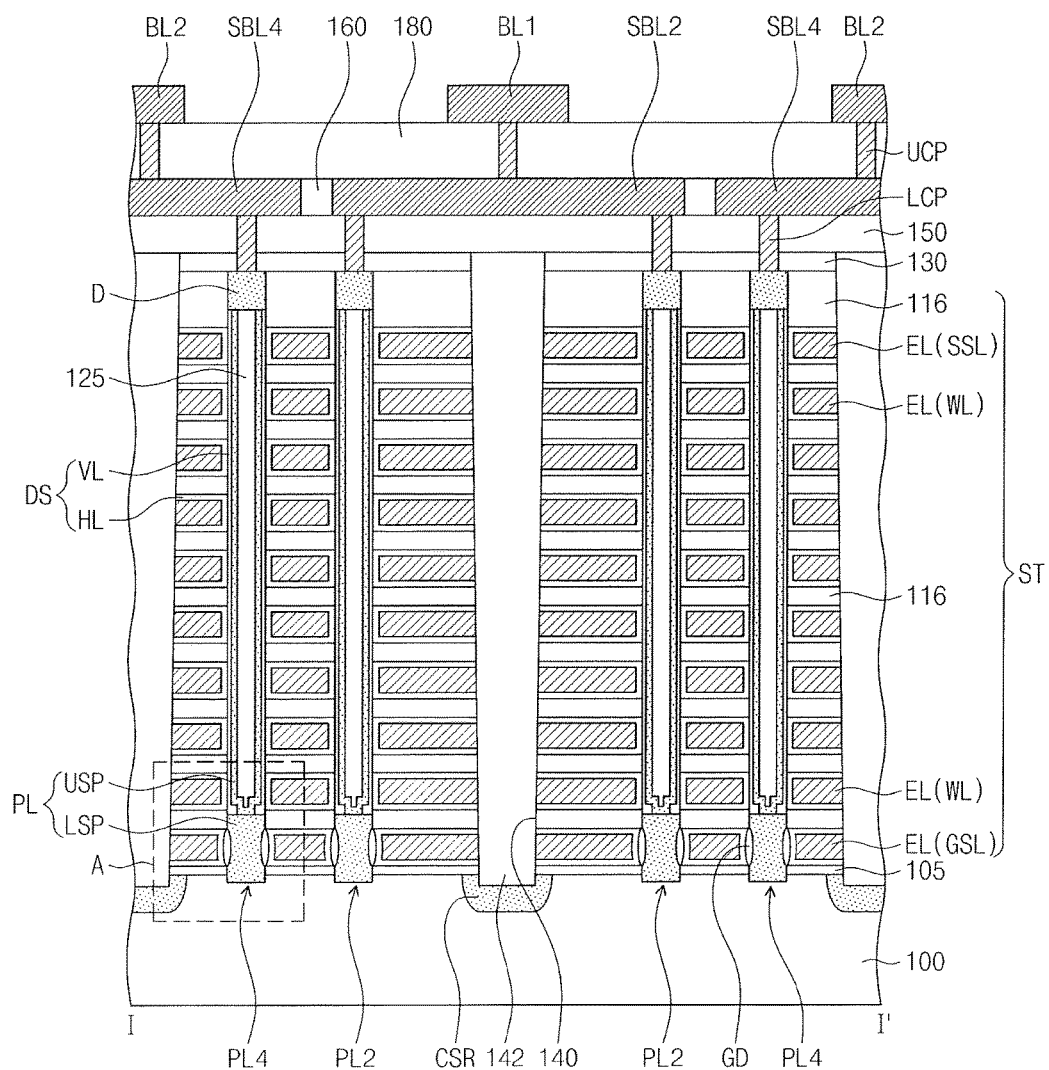
FIG. 4 illustrates a view taken along section line FT in FIG. 3.
Figure 5A:
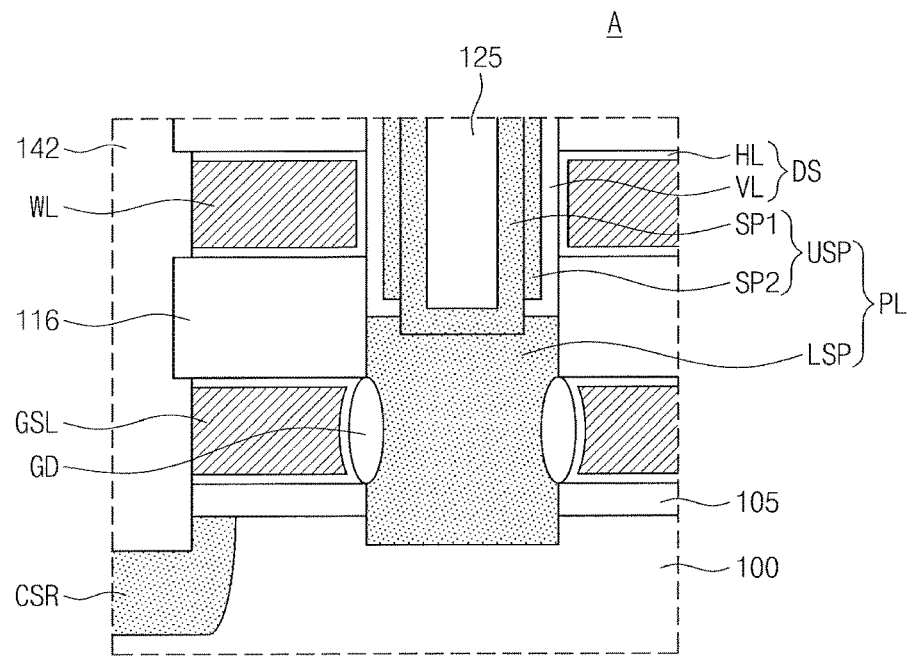
FIGS. 5A to 5C illustrate an embodiment of section A in FIG. 4.
Figure 5B:
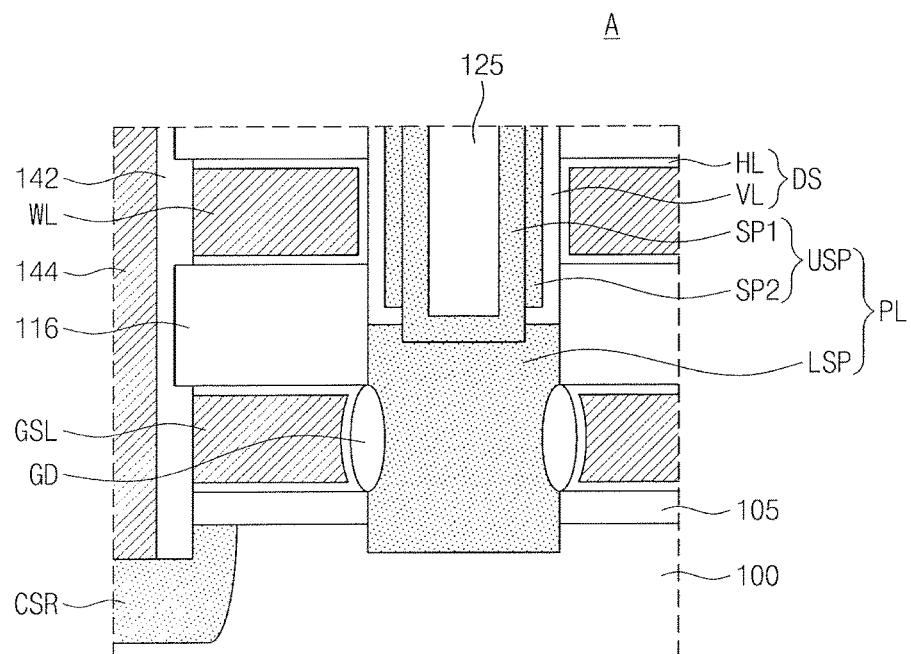
Figure 5C:
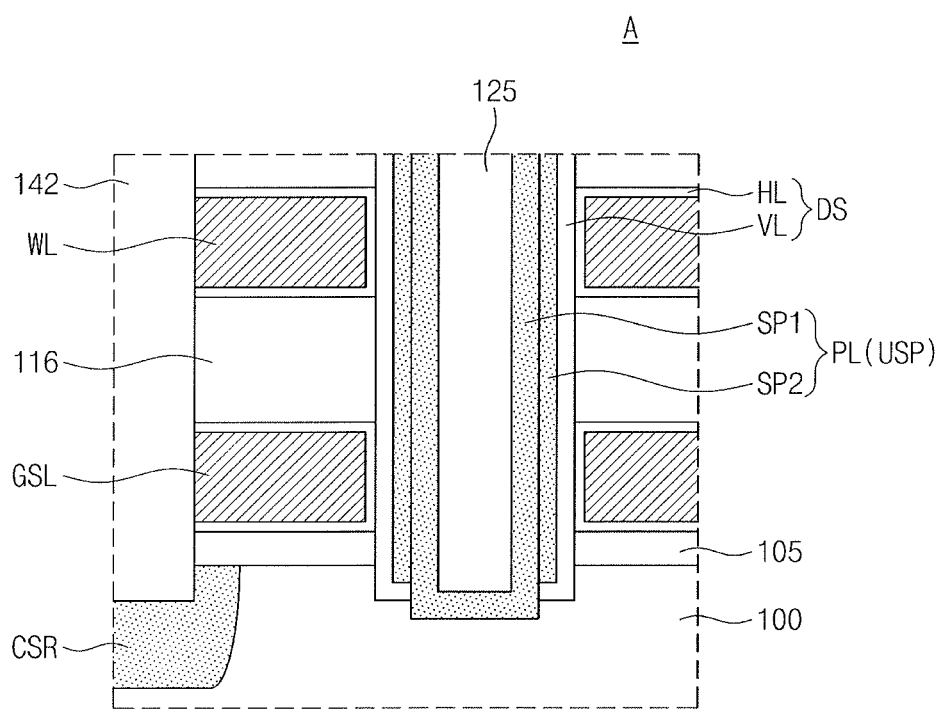
Figure 6:
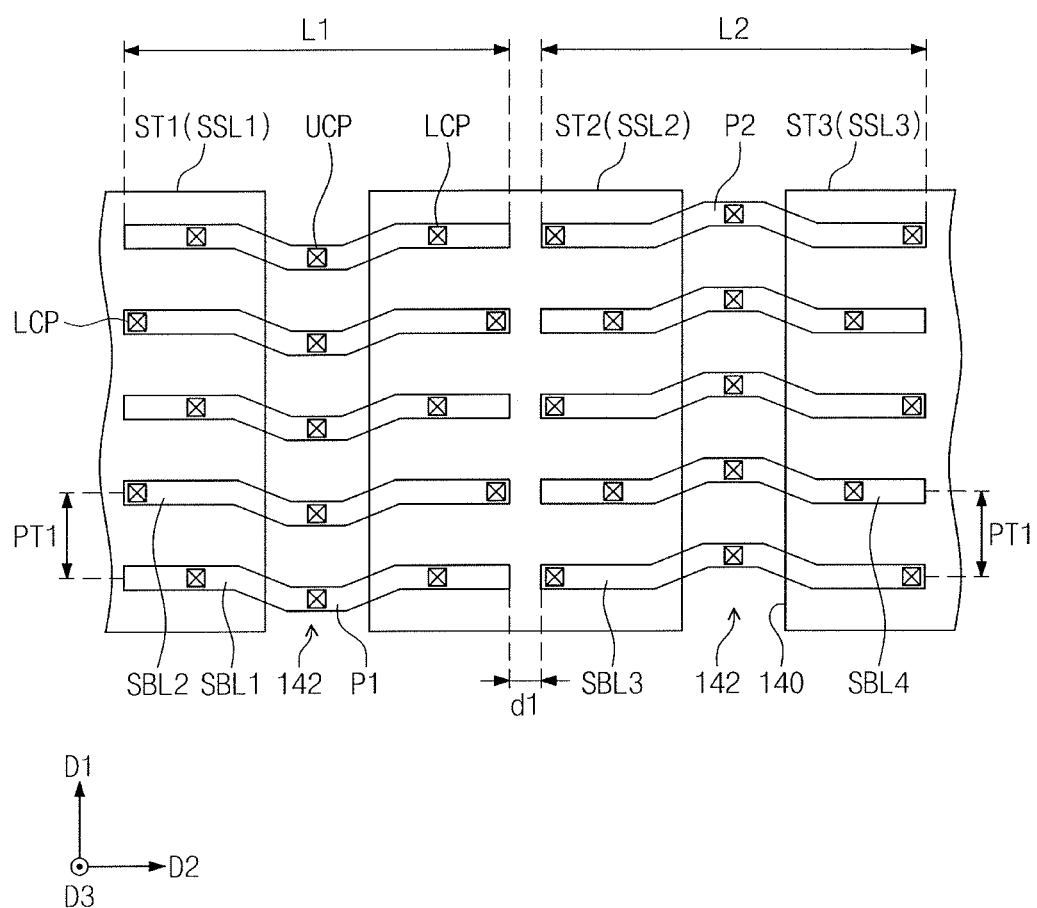
FIG. 6 illustrates an embodiment of a portion in FIG. 3.

FIG. 3 illustrates a more detailed embodiment of the semiconductor device. FIG. 4 illustrates a cross-sectional view along line I-I' in FIG. 3. FIGS. 5A to 5C illustrate enlarged views of embodiments of section A in FIG. 4. FIG. 6 illustrates a portion in FIG. 3.

Referring to FIGS. 3, 4, and 5A, stack structures ST may be on a substrate 100. The stack structures ST may extend parallel in a first direction D1 and may be spaced apart from each other in a second direction D2 crossing the first direction D1. The substrate 100 may be a semiconductor substrate having a first conductivity, for example, P-type conductivity. The semiconductor substrate may include at least one of a single crystalline silicon layer, an SOI (silicon on insulator) substrate, a silicon layer on a silicon-germanium (SiGe) layer, a single crystalline silicon layer an insulation layer, or a polysilicon layer on an insulation layer.

Each of the stack structures ST may include insulation patterns 116 and gate electrodes EL that are vertically and alternately stacked on the substrate 100. The gate electrodes EL may include, for example, a ground select line GSL, word lines WL, and a string select line SSL that are sequentially stacked on the substrate 100. The ground select line GSL, the word lines WL, and the string select line SSL may constitute the cell string CSTR discussed with respect to FIG. 2. In one embodiment, one ground select line GSL and one string select line SSL may be provided per section of the device, and eight word lines WL may be stacked between the ground select line GSL and the string select line SSL in that section. In other embodiments, a plurality of ground select lines GSL, a plurality of string select lines SSL, and/or a different number (e.g., nine or more) the word lines WL may be provided. The gate electrodes GE may include doped silicon, metal (e.g., tungsten), metal nitride, metal silicide, or a combination thereof.

The insulation patterns 116 may have a thickness that is different (or changes) based on characteristics of a semiconductor device. For example, the insulation patterns 116 may have substantially the same thickness. In one embodiment, at least one (e.g., an uppermost insulation pattern) of the insulation patterns 116 may be formed to be thicker than other insulation patterns 116 between the word lines WL. The insulation patterns 116 may include, for example, a silicon oxide layer. A buffer insulation layer 105 may be between the substrate 100 and the stack structures ST. The buffer insulation layer 105 may be, for example, a silicon oxide layer. The thickness of the buffer insulation layer 105 may be different from (e.g., less than) the thickness of one or more of the overlying insulation patterns 116.

A first separating insulation layer 142 may be between the stack structures ST. The first separating insulation layer 142 may be in a first separation region 140 extending in the first direction D1 between the stack structures ST. For example, the first separating insulation layer 142 may horizontally separate the gate electrodes EL of the stack structures ST adjacent to each other. A common source region CSR may be in the substrate 100 below the first separating insulation layer 142. The common source region CSR may extend along the first direction D1 in the substrate 100. The common source region CSR may have a second conductivity (e.g., N-type conductivity) different from the first conductivity.

In some embodiments, as shown in FIG. 5B, the common source region CSR may be coupled to a common source plug 144 that penetrates the first separating insulation layer 142. For example, the common source plug 144 may have a linear shape extending in the first direction D1 between the stack structures ST adjacent to each other. In one embodiment, the common source plug 144 may have a pillar shape penetrating the first separating insulation layer 142 and locally coupled to the common source region CSR.

The substrate 100 may be coupled to vertical pillars PL penetrating the stack structures ST. The vertical pillars PL may be in vertical holes 120 that penetrate the stack structures ST and expose the substrate 100. The vertical pillars PL may have a major (or long) axis extending upward (e.g., extending in a third direction D3) from the substrate 100. The vertical pillars PL may have lower ends connected to the substrate 100 and upper ends connected to bit lines BL1 and BL2. The vertical pillar PL may include conductive pads D, at their top ends, coupled to respective lower contacts LCP. The vertical pillars PL may be combined with the gate electrodes EL.

The vertical pillars PL may include a semiconductor material or a conductive material. In some embodiments, as shown in FIG. 5A, each of the vertical pillars PL may include a lower semiconductor pattern LSP and an upper semiconductor pattern USP. For example, the lower and upper semiconductor patterns LSP and USP may include silicon (Si), germanium (Ge), or a combination thereof, and may have different crystal structures from each other. The lower and upper semiconductor patterns LSP and USP may have a crystal structure including one or more of a single crystalline structure, an amorphous structure, or a polycrystalline structure. The lower and upper semiconductor patterns LSP and USP may be undoped or doped with an impurity having a conductivity which is the same as that of the substrate 100.

The substrate 100 may be in direct contact with the lower semiconductor pattern LSP that penetrates the ground select line GSL. In addition, the lower semiconductor pattern LSP may have a lower end inserted into the substrate 100. The upper semiconductor pattern USP may include a first semiconductor pattern SP1 and a second semiconductor pattern SP2. The first semiconductor pattern SP1 may be coupled to the lower semiconductor pattern LSP, and has a predetermined (e.g., macaroni noodle or pipe) shape having a closed bottom end.

The interior of the first semiconductor pattern SP1 may ne filled with a buried insulation layer 125. In addition, the first semiconductor pattern SP1 may be in contact with an inner wall of the second semiconductor pattern SP2 and a top surface of the lower semiconductor pattern LSP. In this configuration, the first semiconductor pattern SP1 may electrically connect the second semiconductor pattern SP2 to the lower semiconductor pattern LSP.

The second semiconductor pattern SP2 may have a predetermined (e.g., macaroni noodle or pipe) shape having open top and bottom ends. The second semiconductor pattern SP2 may be spaced apart from the lower semiconductor pattern LSP, without being in contact therewith. A gate dielectric layer GD may be between the lower semiconductor pattern LSP and the ground select line GSL. The gate dielectric layer GD may be, for example, a silicon oxide layer.

In other embodiments, the vertical pillars PL may have no lower semiconductor pattern LSP. In this configuration, as shown in FIG. 5C, the vertical pillar PL may include the first and second semiconductor patterns SP1 and SP2. The substrate 100 may be in direct contact with the lower semiconductor patterns LSP penetrating the ground select line GSL. In addition, the first semiconductor pattern SP1 may be in contact with an inner wall of the second semiconductor pattern SP2 and a top surface of the lower semiconductor pattern LSP. In this configuration, the first semiconductor pattern SP1 may electrically connect the second semiconductor pattern SP2 to the substrate 100. The first semiconductor pattern SP1 may have a bottom surface lower than the top surface of the substrate 100.

The vertical pillars PL may be arranged along the first and second directions D1 and D2 to constitute a plurality of columns. For example, the vertical pillars PL may include first, second, third, and fourth vertical pillars PL1, PL2, PL3, and PL4 arranged in a predetermined (e.g., zigzag) fashion along the second direction D2 or in a direction opposite to the second direction D2. The first to fourth vertical pillars PL1 to PL4 may be disposed along the first direction D1 to form first to fourth columns, respectively. In the present embodiment, four columns of vertical pillars PL extend in the first direction D1 and penetrate corresponding stack structures ST (e.g., columns of vertical pillars PL penetrate one string select line SSL). In other embodiments, a different number of columns of vertical pillars PL penetrating one string select line SSL may be provided. For a pair of neighboring columns, the vertical pillars PL constituting one column may shift in the first direction D1 relative to the vertical pillars PL constituting the other adjacent columns. Accordingly, the vertical pillars PL in a pair of columns including one column and its adjacent other column may be disposed in a zigzag fashion along the first direction D1.

Lower contacts LCP may be on corresponding vertical pillars PL, and thus arranged in the same way as the vertical pillars PL. For example, the lower contacts LCP on one string select line SSL may constitute a plurality of columns, and the lower contacts LCP of one column may shift in the first direction D1 relative to the lower contacts LCP of its adjacent column. Accordingly, the lower contacts LCP in a pair of columns including one column and its adjacent other column may be arranged in a zigzag pattern along the first direction D1.

Data storage layers DS may be between the stack structures ST and the vertical pillars PL. As shown in FIG. 5A, the data storage layers DS may include vertical insulation layers VL penetrating the stack structure ST and horizontal insulation layers HL between the gate electrodes EL and the vertical insulation layers VL. The horizontal insulation layers HL may extend toward top and bottom surfaces of gate electrodes EL. In some embodiments, a semiconductor device may be a NAND Flash memory device.

The data storage layer DS may include, for example, a tunnel insulation layer, a charge storage layer, and a blocking insulation layer. The charge storage layer may be an insulation layer including a charge trap layer or a conductive nanoparticle. In one embodiment, the charge storage layer may include one or more of a silicon nitride layer, a silicon oxynitride layer, a silicon-rich nitride layer, or a nanocrystalline silicon layer. The tunnel insulation layer may include one or more materials having a band gap greater than that of the charge storage layer. The tunnel insulation layer may include, for example, a silicon oxide layer. The blocking insulation layer may include one or more of a first blocking layer inclusive of a silicon oxide layer or a second blocking layer inclusive of a high-k dielectric layer, such as an aluminum oxide layer or a hafnium oxide layer. Data stored in the data storage layer DS may be changed using, for example, Fouler-Nordheim tunneling induced by a voltage difference between the gate electrodes EL and the vertical pillars PL that include a semiconductor material.

A capping insulation layer 130, a first interlayer dielectric layer 150, and a second interlayer dielectric layer 160 may sequentially cover the stack structures ST. The second interlayer dielectric layer 160 may include subsidiary lines SBL1, SBL2, SBL3, and SBL4 that are coupled to the lower contacts LCP. The subsidiary lines SBL1 to SBL4 may be connected to the vertical pillars PL through the lower contacts LCP penetrating the first interlayer dielectric layer 150 and the capping insulation layer 130. For example, each of the subsidiary lines SBL1 to SBL4 may connect a pair of the vertical pillars PL, which are connected to the string select lines SSL different from and adjacent to each other in the second direction D2.

The second interlayer dielectric layer 160 may include a third interlayer dielectric layer 180 covering the subsidiary lines SBL1 to SBL4. The bit lines BL1 and BL2 may be on the third interlayer dielectric layer 180. The bit lines BL1 and BL2 may be connected to the subsidiary lines SBL1 to SBL4 through upper contacts UCP penetrating the third interlayer dielectric layer 180. Each of the insulation layers 130, 150, 160, and 180 may include one or more of a silicon oxide layer, a silicon nitride layer, a silicon oxynitride layer, or a low-k dielectric layer having a dielectric constant different from (e.g., less than) that of a silicon oxide layer. A metallic material (e.g., tungsten or copper) may be in the lower and upper contacts LCP and UCP, the subsidiary lines SBL1 to SBL4, and the bit lines BL1 and BL2.

Referring to FIGS. 3 and 6, the stack structures ST may include first to third stack structures ST1 to ST3 disposed along the second direction D2. The string select line of the first stack structure ST1 may be referred to as a first string select line SSL1. The string select line of the second stack structure ST2 may be referred to as a second string select line SSL2. The string select line of the third stack structure ST3 may be referred to as a third string select line SSL3. The first to third string select lines SSL1 to SSL3 may be alternately disposed along the second direction D2.

Each of the first to fourth vertical pillars PL1 to PL4 may be connected to a corresponding one of the first to third string select lines SSL1 to SSL3. The first and fourth vertical pillars PL1 and PL4 may be adjacent to edges of the corresponding one of the first to third string select lines SSL1 to SSL3. The second and third vertical pillars PL2 and PL3 may be between the first vertical pillars PL1 and the fourth vertical pillars PL4. The second vertical pillars PL2 may shift in the first direction D1 from the first vertical pillars PL1. The fourth vertical pillars PL4 may shift in the first direction D1 from the third vertical pillars PL3.

The first to fourth vertical pillars PL1 to PL4 connected to one string select line, and its adjacent string select line may be arranged to have mirror symmetry across the first separating insulation layer 142. For example, the first to fourth vertical pillars PL1 to PL4 connected to the first string select line SSL1 and the second string select line SSL2 may be arranged to have mirror symmetry across the first separating insulation layer 142. Accordingly, each first vertical pillar of a pair of the first vertical pillars PL1 is connected to a corresponding one of the first or second string select lines SSL1 and SSL2, which are spaced apart from each other in the second direction D2 across the first separating insulation layer 142. In addition, each second vertical pillar of a pair of the second vertical pillars PL2 is connected to a corresponding one of the first or second string select lines SSL1 and SSL2, which may be spaced apart from each other in the second direction D2 across the first separating insulation layer 142.

Thus, the first vertical pillars PL1 may be most adjacent to the first separating insulation layer 142, and the second vertical pillars PL2 may be disposed in an oblique direction relative to the first vertical pillars PL1. The first vertical pillars PL1 adjacent to each other may be spaced apart at a predetermined interval that is different from (e.g., less than) an interval between the second vertical pillars PL2 adjacent to each other.

The first to fourth vertical pillars PL1 to PL4 connected to the second string select line SSL2 and the third string select line SSL3 may be arranged to have mirror symmetry across the first separating insulation layer 142. Accordingly, each third vertical pillar of a pair of the third vertical pillars PL3 is connected to a corresponding one of the second and third string select lines SSL2 and SSL3, which may be spaced apart from each other in the second direction D2 across the first separating insulation layer 142. In addition, each fourth vertical pillar of a pair of the fourth vertical pillars PL4 is connected to a corresponding one of the second and third string select lines SSL2 and SSL3, which may be spaced apart from each other in the second direction D2 across the first separating insulation layer 142.

Thus, the third vertical pillars PL3 may be most adjacent to the first separating insulation layer 142, and the fourth vertical pillars PL4 may be disposed in an oblique direction relative to the third vertical pillars PL3. The fourth vertical pillars PL4 adjacent to each other may be spaced apart at a predetermined interval different from (e.g., less than) an interval between the third vertical pillars PL3 that are adjacent to each other. Pairs of neighboring first vertical pillars PL1 and pairs of neighboring third vertical pillars PL3 may be alternately disposed along the second direction D2, Also, pairs of neighboring second vertical pillars PL2 and pairs of neighboring fourth vertical pillars PL4 may be alternately disposed along the second direction D2.

The subsidiary lines SBL1 to SBL4 may include first to fourth subsidiary lines SBL1 to SBL4. The first subsidiary lines SBL1 may connect pairs of the first vertical pillars PL1 adjacent to each other in the second direction D2. The second subsidiary lines SBL2 may connect pairs of the second vertical pillars PL2 adjacent to each other in the second direction D2. The first and second subsidiary lines SBL1 and SBL2 may be alternately disposed along the first direction D1. Pitches (or intervals) between the first and second subsidiary lines SBL1 and SBL2 may have a substantially uniform first pitch (or a first interval) PT1.

In accordance with at least one embodiment, a pitch between the subsidiary lines may correspond to a spacing interval between center lines of the subsidiary lines. Each of the first and second subsidiary lines SBL1 and SBL2 may be elongated in the second direction D2 and may have a first protrusion P1 that protrudes in a direction opposite to the first direction D1. The first protrusion P1 may extend onto and overlap the first separating insulation layer 142. In the present embodiment, the first protrusion P1 is illustrated to extend in the opposite direction to the first direction D1. In other embodiments, the first protrusion P1 may protrude in another direction, e.g., the first direction D1.

The third subsidiary lines SBL3 may connect pairs of the third vertical pillars PL3 adjacent to each other in the second direction D2. The fourth subsidiary lines SBL4 may connect pairs of the fourth vertical pillars PL4 adjacent to each other in the second direction D2. The third and fourth subsidiary lines SBL3 and SBL4 may be alternately disposed along the first direction D1. The pitch between the third and fourth subsidiary lines SBL3 and SBL4 may be substantially the same as the first pitch PT1 between the first and second subsidiary lines SBL1 and SBL2. In addition, the third and fourth subsidiary lines SBL3 and SBL4 may be spaced apart respectively from the first and second subsidiary lines SBL1 and SBL2 in the second direction D2 or in a direction opposite to the second direction D2.

In this configuration, the first and third subsidiary lines SBL1 and SBL3 may be alternately disposed along the second direction D2, and the second and fourth subsidiary lines SBL2 and SBL4 may be alternately disposed along the second direction D2. Each of the third and fourth subsidiary lines SBL3 and SBL4 may be elongated in the second direction D2 and may have a second protrusion P2 that protrudes in the first direction D1. The second protrusion P2 may extend onto and overlap the first separating insulation layer 142.

In some embodiments, first and second ends of each of the subsidiary lines disposed along the first direction D1 may be aligned along the first direction D1. For example, first ends of the first subsidiary lines SBL1 and first ends of the second subsidiary lines SBL2 may be aligned in the first direction D1. Also, second ends of the first subsidiary lines SBL1 and second ends of the second subsidiary lines SBL2 may be aligned in the first direction D1. The first and second subsidiary lines SBL1 and SBL2 may therefore have substantially the same first length L1, e.g., a length corresponding to a straight line between the first and second ends of each subsidiary line.

Likewise, first ends of the third subsidiary lines SBL3 and first ends of the fourth subsidiary lines SBL4 may be aligned in the first direction D1. Second ends of the third subsidiary lines SBL3 and second ends of the fourth subsidiary lines SBL4 may be aligned in the first direction D1. The third and fourth subsidiary lines SBL3 and SBL4 may therefore have substantially the same second length L2. In one embodiment, the first length L1 may be the same as the second length L2. In another embodiment, the first length L1 may be different from the second length L2.

A substantially same first distance d1 may be between the first and third subsidiary lines SBL1 and SBL3 adjacent to each other in the second direction D2 and between the second and fourth subsidiary lines SBL2 and SBL4. The distance between the subsidiary lines adjacent to each other in the second direction D2 may correspond to a spacing interval between facing ends of neighboring subsidiary lines. In some embodiments, the first distance d1 may be different from (e.g., less than) the first pitch PT1. For example, the first distance d1 may be in the range from about 40 nm to about 50 nm, and the first pitch PT1 may be in the range from about 70 nm to about 80 nm. The first distance d1 and/or first pitch PT1 may be in different ranges in other embodiments.

The lower contacts LCP connecting the vertical pillars PL1 to PL4 to the subsidiary lines SBL1 to SBL4 may have the same arrangement as that of the vertical pillars PL1 to PL4. For example, the first separating insulation layer 142 may be closer to the lower contacts LCP between the first subsidiary lines SBL1 and the first vertical pillars PL1 than to the lower contacts LCP between the second subsidiary lines SBL2 and the second vertical pillars PL2. Accordingly, a pair of the lower contacts LCP connected to each of the first subsidiary lines SBL1 may be spaced apart at an interval different from (e.g., less than) that between a pair of the lower contacts LCP connected to each of the second subsidiary lines SBL2.

Likewise, the first separating insulation layer 142 may be to the lower contacts LCP between the fourth subsidiary lines SBL4 and the fourth vertical pillars PL4 than to the lower contacts LCP between the third subsidiary lines SBL3 and the third vertical pillars PL3. Accordingly, a pair of the lower contacts LCP connected to each of the fourth subsidiary lines SBL4 may be spaced apart at an interval different from (e.g., less than) that between a pair of the lower contacts LCP connected to each of the third subsidiary lines SBL3.

The bit lines BL1 and BL2 may include first and second bit lines BL1 and BL2 that are alternately disposed along the first direction D1. The first bit lines BL1 may be connected to the first and second subsidiary lines SBL1 and SBL2. The second bit lines BL2 may be connected to the third and fourth subsidiary lines SBL3 and SBL4. The first and second bit lines BL1 and BL2 may extend in the second direction D2.

The upper contacts UCP connecting the subsidiary lines SBL1 to SBL4 to the bit lines BL1 and BL2 may be on the protrusions P1 and P2 of the subsidiary lines SBL1 to SBL4, so that the first separating insulation layer 142 may be thereon with the upper contacts UCP. The upper contacts UCP on the first and second subsidiary lines SBL1 and SBL2 may shift at, for example, half a pitch between the bit lines BL1 and BL2 from the lower contacts LCP in a direction opposite to the first direction D1. The upper contacts UCP on the third and fourth subsidiary lines SBL3 and SBL4 may shift at, for example, haft a pitch between the bit lines BL1 and BL2 from the lower contacts LCP in the first direction D1. The shift amounts may be different in other embodiments.

In some embodiments, subsidiary lines (e.g., the first subsidiary lines SBL1) connecting vertical pillars (or lower contacts) relatively close to each other and subsidiary lines (e.g., the second subsidiary lines SBL2) connecting vertical pillars (or lower contacts) relatively far away from each other may have substantially the same length and be alternately disposed at a regular pitch. As a result, it may be possible to enhance a process margin in subsequent processes and increase a yield in manufacturing semiconductor devices.

Figure 7:
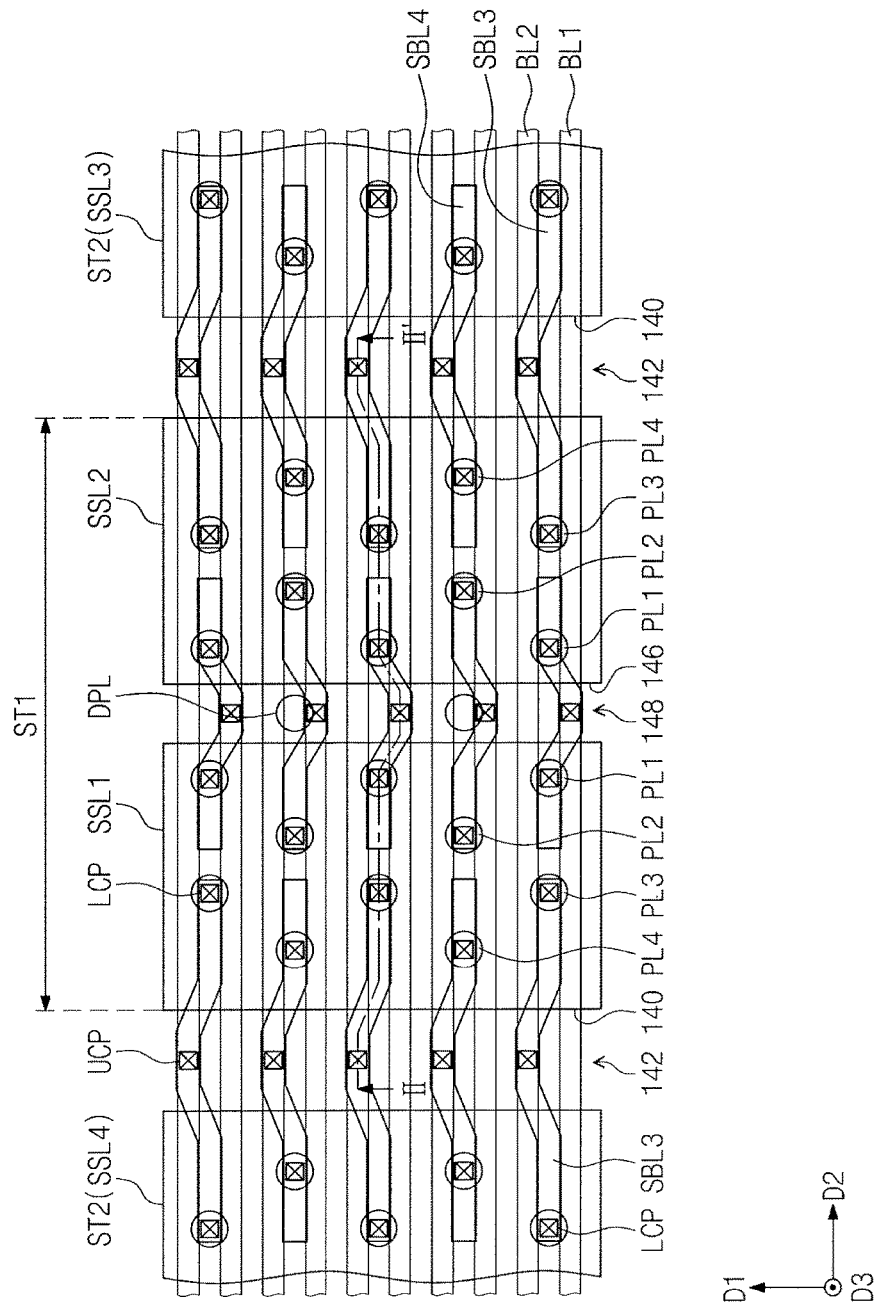
FIG. 7 illustrates another embodiment of a semiconductor device.
Figure 8:
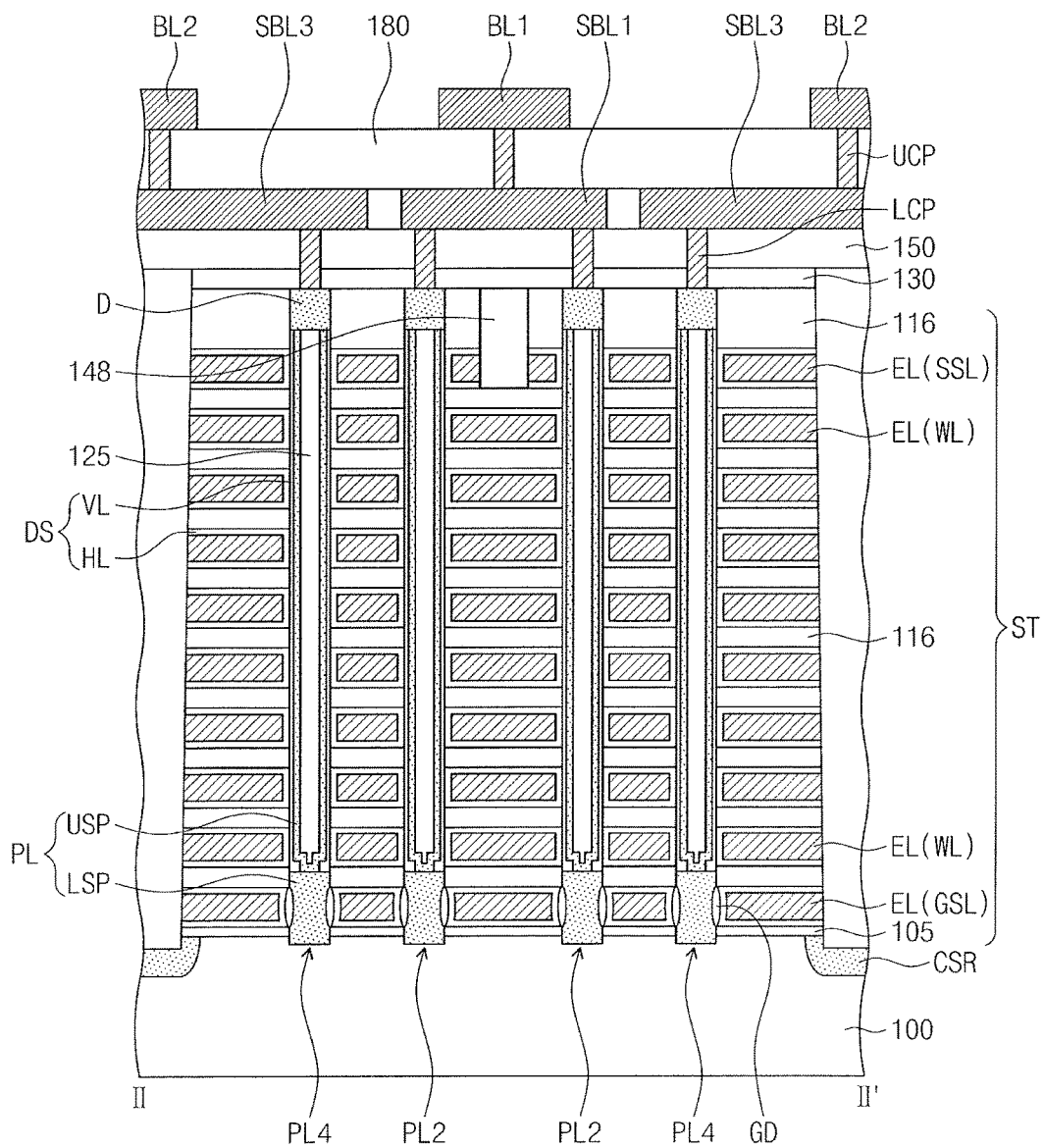
FIG. 8 illustrates a view taken along section line II-IF in FIG. 7.
Figure 9:
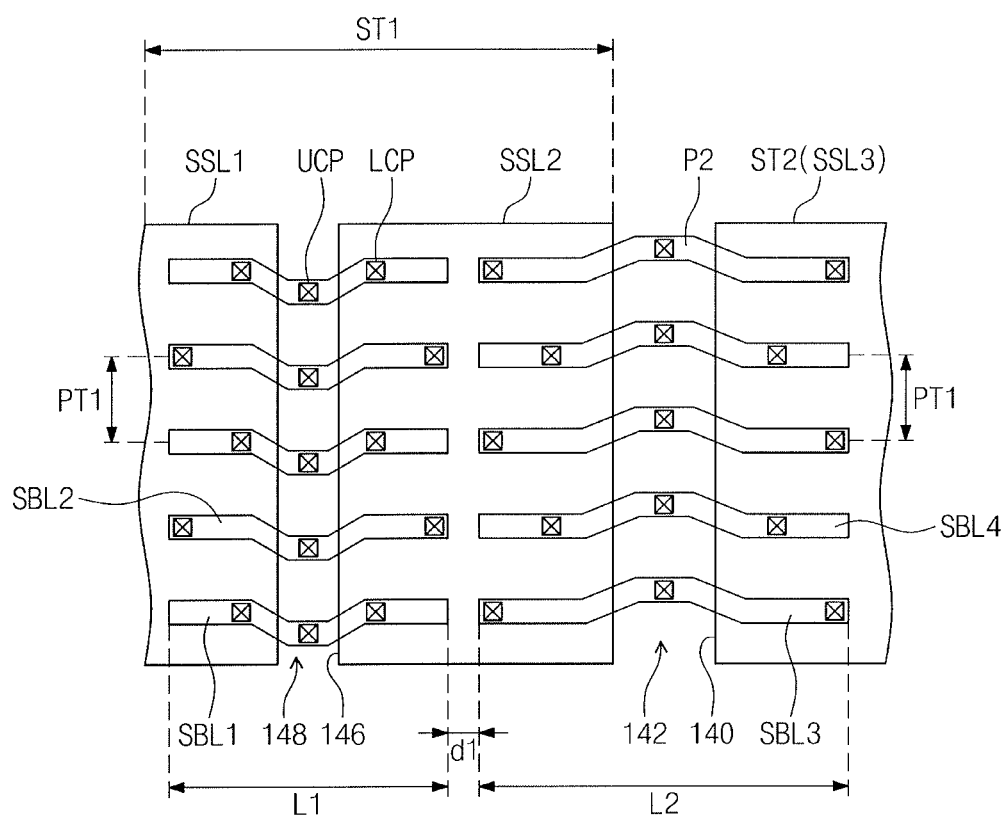
FIG. 9 illustrates an embodiment of a portion of FIG. 7.

FIG. 7 illustrates another embodiment of a semiconductor device. FIG. 8 illustrates a cross-sectional view taken along line II-IF in FIG. 7. FIG. 9 illustrates an embodiment of a portion in FIG. 7.

Referring to FIGS. 7 to 9, the stack structures ST may include the first and second stack structures ST1 and ST2 spaced apart from each other the second direction D2. The first and second stack structures ST1 and ST2 may be spaced apart from each other across the first separating insulation layer 142 and alternately disposed along the second direction D2. The string select line of each of the first and second stack structures ST1 and ST2 may be divided into two string select lines by a second separating insulation layer 148. As such, the string select line of the first stack structure ST1 may be divided into a first string select line SSL1 and a second string select line SSL2. The string select line of the second stack structure ST2 may be divided into a third string select line SSL3 and a fourth string select line SSL4. The first to fourth string select lines SSL1 to SSL4 may be alternately disposed in the second direction D2.

The second separating insulation layer 148 may be in a second separation region 146. The second separation region 146 may separate the string select line SSL but not the gate electrodes EL below the string select line SSL. For example, as shown in FIG. 8, the second separating insulation layer 148 may have a bottom surface higher than a top surface of an uppermost word line WL and equal to or lower than a bottom surface of the string select line SSL.

From a different point of view, a separating insulation layer according to one or more exemplary embodiments may include the first separating insulation layer 142 and the second separating insulation layer 148 that are spaced apart in the second direction D2. String select lines may be defined by the first and second separating insulation layers 142 and 148. At least one of the separating insulation layers spaced apart in the second direction D2 may be a separating insulation layer that separates the word lines WL in the second direction D2. According to one or more exemplary embodiments, the first separating insulation layer 142 may separate the word lines WL in the second direction D2. The second separating insulation layer 148 may separate only string select lines. The width of the second separating insulation layer 148 may be less than the width of the first separating insulation layer 142. The first and second separating layers 142 and 148 may be alternately disposed along the second direction D2.

Each of the first to fourth vertical pillars PL1 to PL4 may be connected to a corresponding one of the first to fourth string select lines SSL1 to SSL4. The first to fourth vertical pillars PL1 to PL4 may be arranged in a manner identical or similar to that discussed with reference to FIGS. 3 and 6. For example, the first to fourth vertical pillars PL1 to PL4 may be arranged in a zigzag pattern along the first and second directions D1 and D2 to constitute first to fourth columns. In addition, the first to fourth vertical pillars PL1 to PL4 connected to one string select line and its adjacent string select line may be arranged to have mirror symmetry across the first separating insulation layer 142 or the second separating insulation layer 148.

The first subsidiary lines SBL1 may connect pairs of the first vertical pillars PL1 spaced apart from each other in the second direction D2 across the second separating insulation layer 148. The second subsidiary lines SBL2 may connect pairs of the second vertical pillars PL2 spaced apart from each other in the second direction D2 across the second separating insulation layer 148. The first and second subsidiary lines SBL1 and SBL2 may be alternately disposed along the first direction D1. Pitches (or intervals) between the first and second subsidiary lines SBL1 and SBL2 may have a substantially uniform first pitch (or a first interval) PT1. Each of the first and second subsidiary lines SBL1 and SBL2 may be elongated in the second direction D2 and may have a first protrusion P1 that protrudes in a direction opposite to the first direction D1. The first protrusions P1 may extend onto the second separating insulation layer 148. The first and second subsidiary lines SBL1 and SBL2 may run across the second separating insulation layer 148.

The third subsidiary lines SBL3 may connect pairs of the third vertical pillars PL3 spaced apart from each other in the second direction D2 across the first separating insulation layer 142. The fourth subsidiary lines SBL4 may connect pairs of the fourth vertical pillars PL4 spaced apart from each other in the second direction D2 across the first separating insulation layer 142. The third and fourth subsidiary lines SBL3 and SBL4 may be alternately disposed along the first direction D1. The pitch between the third and fourth subsidiary lines SBL3 and SBL4 may be substantially the same as the first pitch PT1 between the first and second subsidiary lines SBL1 and SBL2.

The third and fourth subsidiary lines SBL3 and SBL4 may be spaced apart respectively from the first and second subsidiary lines SBL1 and SBL2 in the second direction D2 or in a direction opposite to the second direction D2. Each of the third and fourth subsidiary lines SBL3 and SBL4 may be elongated in the second direction D2 and may have a second protrusion P2 that protrudes in the first direction D1. The second protrusions P2 may extend onto the first separating insulation layer 142. The third and fourth subsidiary lines SBL3 and SBL4 may run across the first separating insulation layer 142.

In some embodiments, first and second ends of the first and second subsidiary lines SBL1 and SBL2 may be aligned along the first direction D1. The first and second subsidiary lines SBL1 and SBL2 may therefore have substantially the same first length L1. Likewise, first and second ends of the third and fourth subsidiary lines SBL3 and SBL4 may each be aligned along the first direction D1. The third and fourth subsidiary lines SBL3 and SBL4 may have substantially the same second length L2. In the at least one embodiment, the first and second lengths L1 and L2 may be different, e.g., the first length L1 may be less than the second length L2.

Dummy vertical pillars DPL may penetrate the second separating insulation layer 148, while being disposed along the first direction D1. The dummy vertical pillars DPL may have the same structure as the vertical pillars PL, but may not be provided thereon with the lower contacts LCP for connecting the subsidiary lines SBL1 to SBL4. When nine columns of the vertical pillars are in the stack structures ST divided by the first separating insulation layers 142, the dummy vertical pillars DPL may occupy the fifth column.

Other features may be substantially the same as those discussed with reference to FIGS. 3, 4, and 6. In addition, the embodiments of FIGS. 5A to 5C may also be applicable to the present embodiment.

FIGS. 10A to 15A are plan views of various stages corresponding to an embodiment of a method for fabricating a semiconductor device. FIGS. 10B to 15B illustrate cross-sectional views taken along line I-I' of FIGS. 10A to 15A, respectively.

Figure 10A:
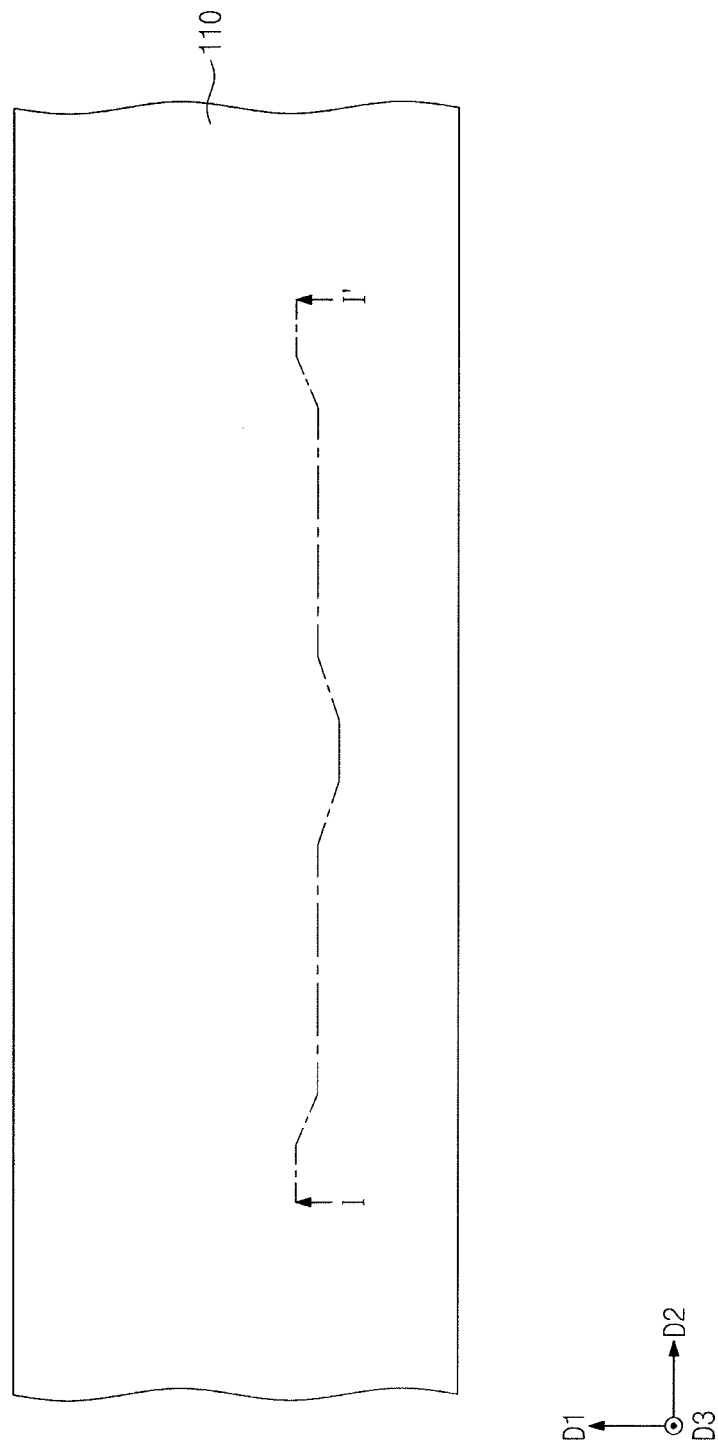
Figure 10B:
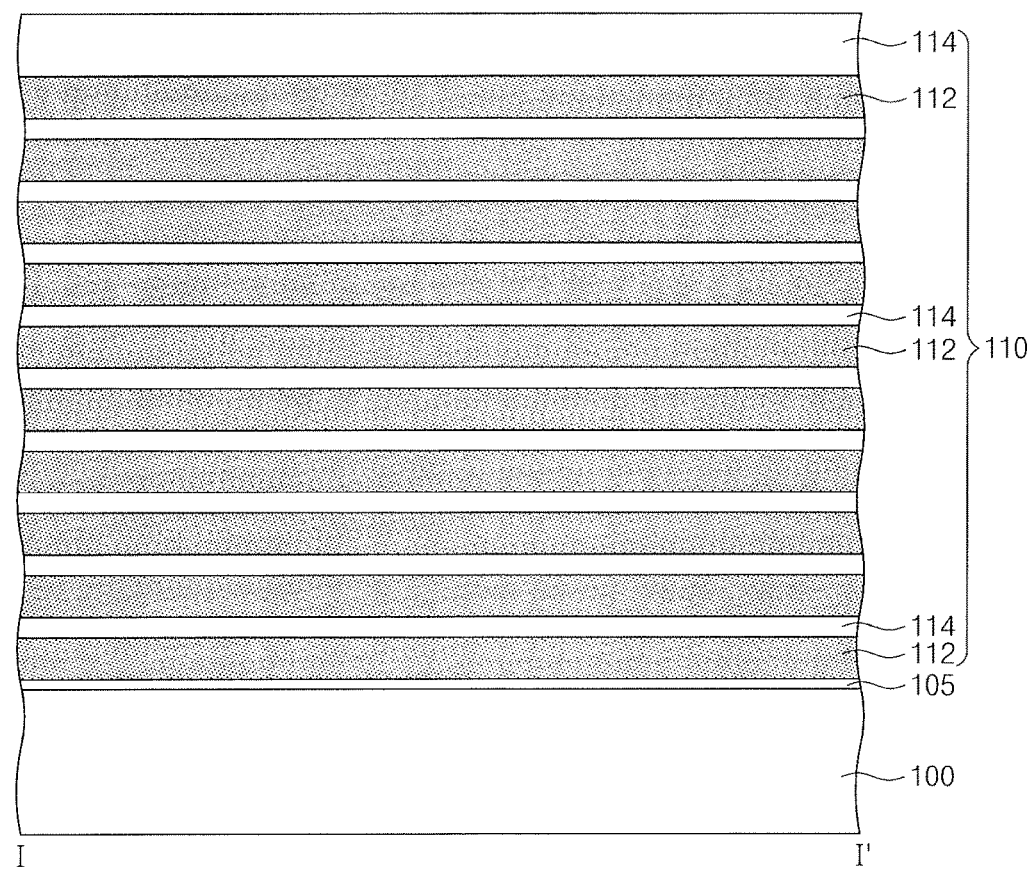

Referring to FIGS. 10A and 10B, sacrificial layers 112 and insulation layers 114 may be alternately and repeatedly stacked on a substrate 100 such that a thin-layer structure 110 may be formed on the substrate 100. The substrate 100 may be a semiconductor substrate having a first conductivity, for example, P-type conductivity. The semiconductor substrate may include at least one of a single crystalline silicon layer, an SOI (silicon on insulator) substrate, a silicon layer formed on a silicon-germanium (SiGe) layer, a single crystalline silicon layer formed an insulation layer, or a polysilicon layer formed on an insulation layer.

The sacrificial layers 112 may be formed of a material that may be etched with an etch selectivity to the insulation layers 114. For example, the sacrificial layers 112 and the insulation layers 114 may exhibit a high etch selectivity to a chemical solution for wet etching and a low etch selectivity to an etching gas for dry etching. The sacrificial layers 112 may be one or more of, for example, a silicon layer, a silicon carbide layer, a silicon oxynitride layer, or a silicon nitride layer. The insulation layers 114 may be one or more of a silicon layer, a silicon oxide layer, a silicon carbide layer, a silicon oxynitride layer, or a silicon nitride layer, but may have a material different from that of the sacrificial layers 112.

In an embodiment, the sacrificial layers 112 may be formed of a silicon nitride layer and the insulation layers 114 may be formed of a silicon oxide layer. In other embodiments, the sacrificial layers 112 may be formed of a silicon layer, and the insulation layers 114 may be formed of a silicon oxide layer. The sacrificial layers 112 and the insulation layers 114 may be formed, for example, by chemical vapor deposition. The insulation layers 114 may have substantially the same thickness, or alternatively one or more of the insulation layers 114 may have a different thickness, from other insulation layers 114. An uppermost insulation layer may have a thickness which is, for example, greater than other insulation layers.

Before the thin-layer structure 110 is formed, a buffer insulation layer 105 may be formed on the substrate 100. The buffer insulation layer 105 may be, for example, a silicon oxide layer formed by thermal oxidation. In one embodiment, the buffer insulation layer 105 may be a silicon oxide layer formed by deposition. The thickness of the buffer insulation layer 105 may be different from (e.g., less than) thicknesses of one or more of the overlying sacrificial layers 112 and insulation layers 114.

Figure 11A:
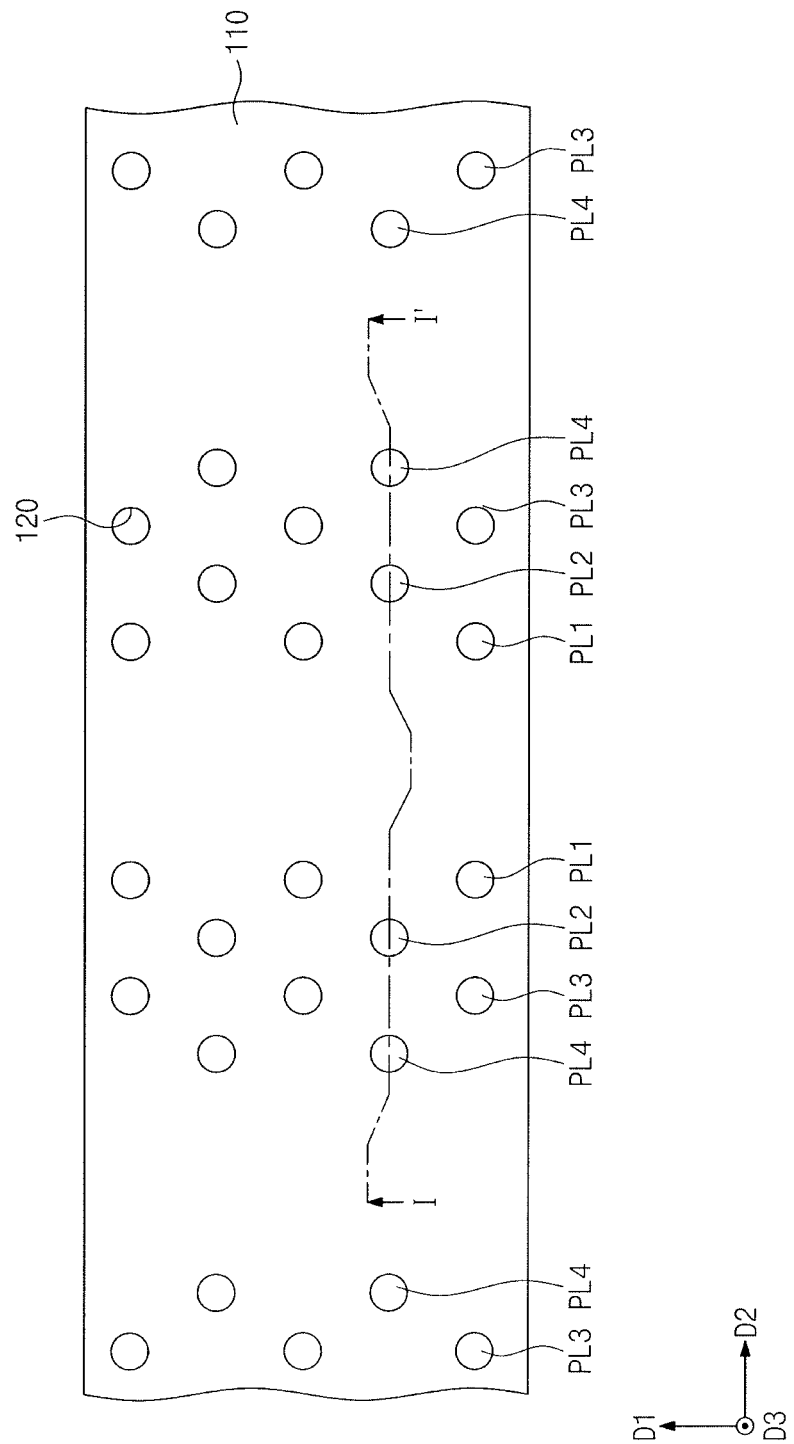
Figure 11B:
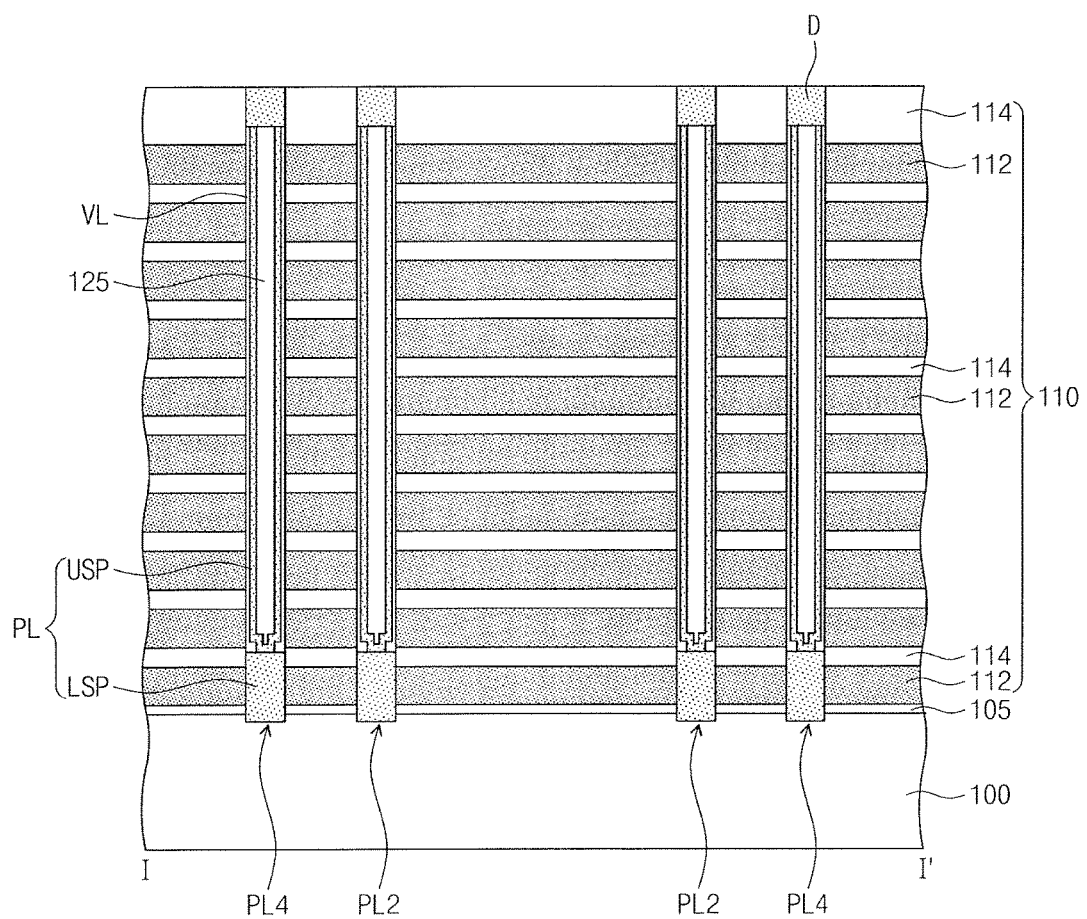

Referring to FIGS. 11A and 11B, vertical holes 120 may penetrate the thin-layer structure 110 and expose the substrate 100. In an embodiment, the vertical holes 120 may be formed, for example, by forming a mask pattern on the thin-layer structure 110 and performing an anisotropic etching process using the mask pattern as an etching mask. The anisotropic etching process may over-etch a top surface of the substrate 100. Thus, the substrate 100 below the vertical holes 120 may be recessed to a predetermined depth. In a plan view, the vertical holes 120 may be arranged in a two-dimensional pattern. For example, the vertical holes 120 may arranged in a zigzag pattern along first and second directions D1 and D2.

Lower semiconductor patterns LSP may be formed, for example, by performing a selective epitaxial growth (SEG) process that uses the substrate 100 exposed through the vertical holes 120 as a seed. The lower semiconductor patterns LSP may include, for example, a material having the same conductivity as that of the substrate 100. The lower semiconductor patterns LSP may be formed to have a pillar shape that fills lower portions of the vertical holes 120.

A vertical insulation layer VL and upper semiconductor patterns USP may be sequentially formed on sidewalls of the vertical holes 120, in which the lower semiconductor patterns LSP are formed.

The vertical insulation layer VL may include a blocking insulation layer, a tunnel insulation layer, and a charge storage layer that are sequentially stacked on the sidewalls of the vertical holes 120. The upper semiconductor pattern USP may have, for example, a hollow pipe or macaroni noodle shape. The upper semiconductor pattern USP may have a closed bottom end. The interior of the upper semiconductor pattern USP may be filled with a buried insulation layer 125. The upper semiconductor pattern USP may have a bottom surface lower than a top surface of the lower semiconductor pattern LSP. For example, the upper semiconductor pattern USP may have a structure inserted into the lower semiconductor pattern LSP. The upper semiconductor pattern USP may include a semiconductor material. In one embodiment, the upper semiconductor pattern USP may include first and second semiconductor patterns SP1 and SP2. The lower and upper semiconductor patterns LSP and USP may correspond to vertical pillars PL.

For example, the vertical pillars PL may include first, second, third, and fourth vertical pillars PL1, PL2. PL3, and PL4 arranged in a predetermined (e.g., zigzag) pattern along the second direction D2 or along a direction opposite to the second direction D2. The first to fourth vertical pillars PL1 to PL4 may be disposed along the first direction D1 to form first to fourth columns, respectively.

Conductive pads D may be formed at upper ends of the vertical pillars PL. The conductive pads D may be formed, for example, by recessing upper portions of the vertical pillars PL and then filling the recess regions with a conductive material. In addition, the conductive pads D may be doped with an impurity having a conductivity different from that of the vertical pillars PL below the conductive pads D. Accordingly, the conductive pads D and their underlying regions may form a diode.

Figure 12A:
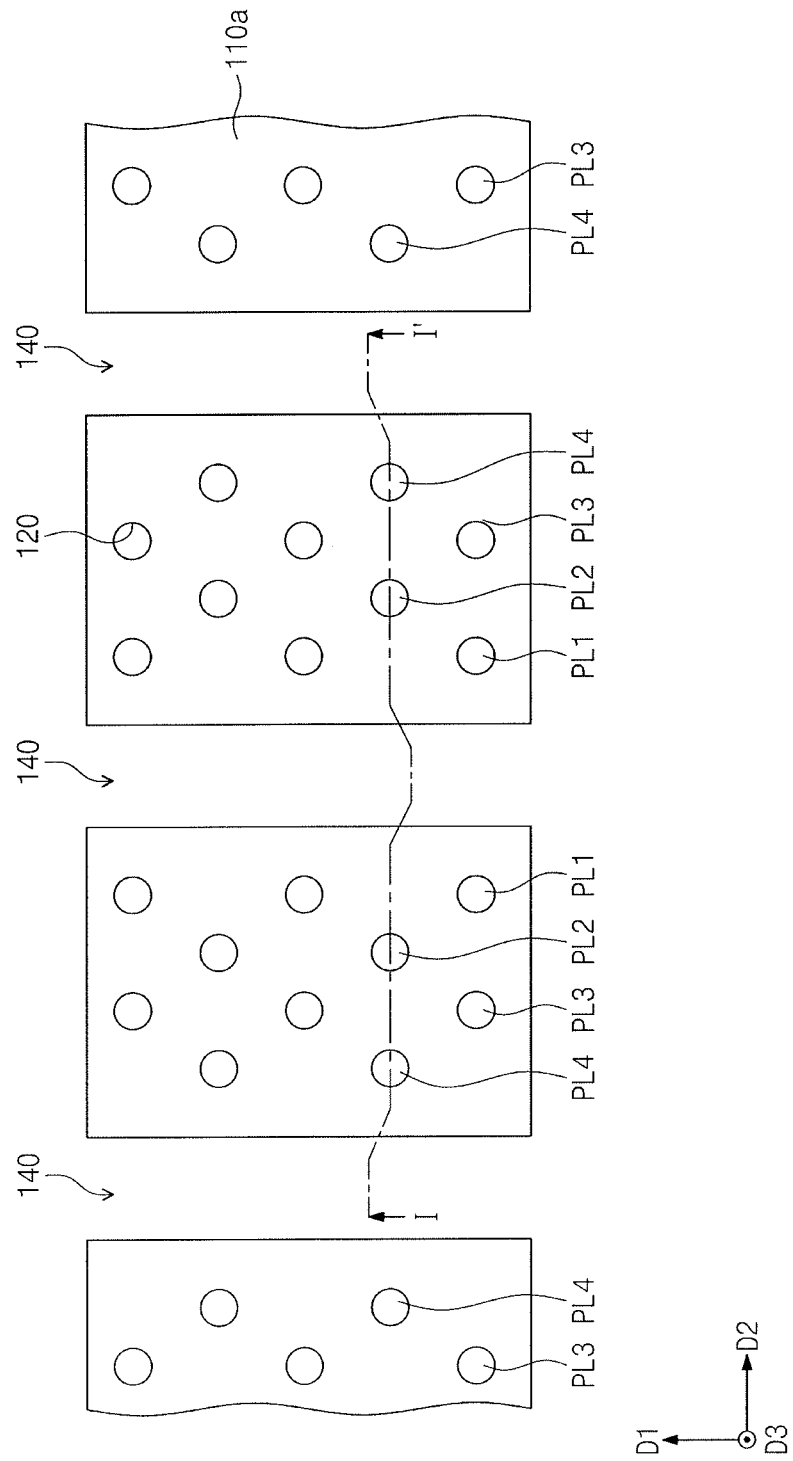
Figure 12B:
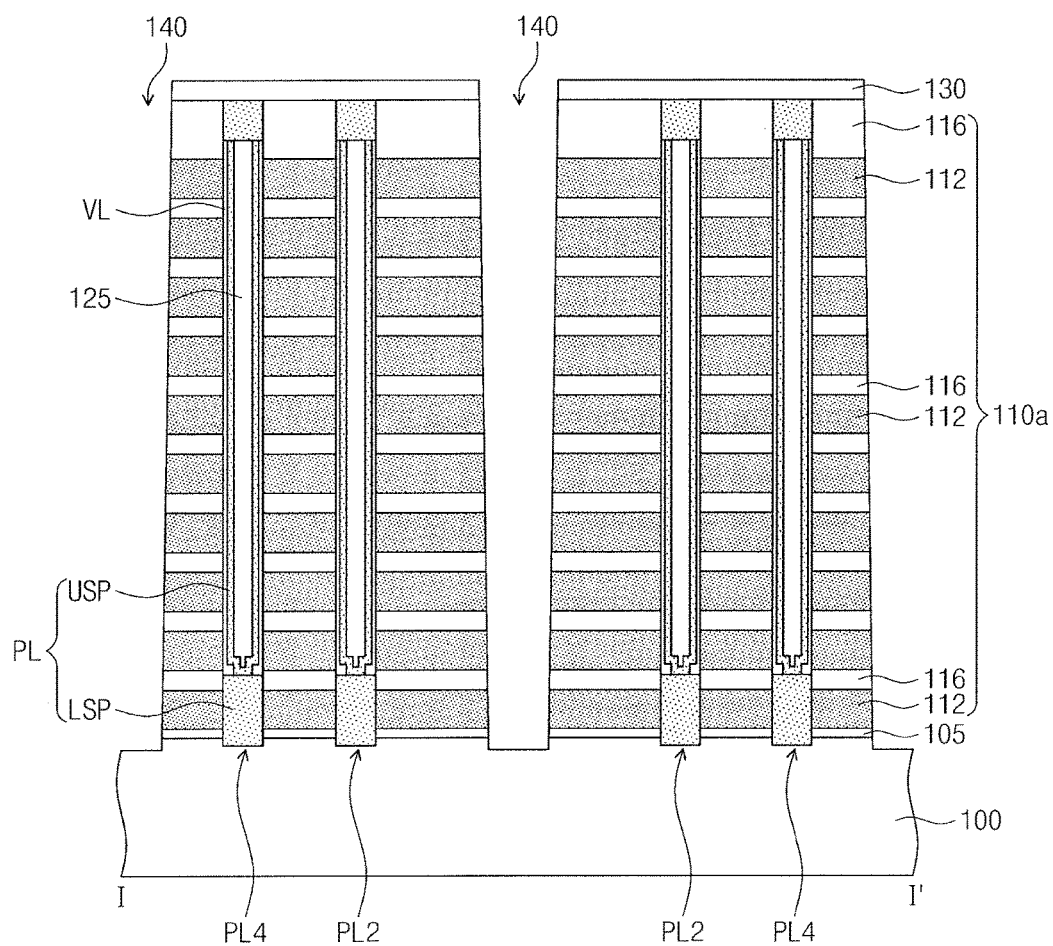

Referring to FIGS. 12A and 12B, the thin-layer structure 110 may be provided thereon with a capping insulation layer 130 covering top surfaces of vertical pillars PL. The capping insulation layer 130 may be or include, for example, of a silicon oxide layer. Subsequently, the thin-layer structure 110 may be patterned to form a first separation region 140 through which the substrate 100 is exposed. For example, the patterning of the thin-layer structure 110 may include forming a mask pattern on the thin-layer structure 110 and then using the mask pattern as an etching mask to successively etching the buffer insulation layer 105, the sacrificial layers 112, and the insulation layers 114. The first separation region 140 may be formed to have a trench shape extending in the first direction D1. During formation of the first separation region 140, an over-etching operation may be performed on the substrate 100, so that its top surface exposed through the first separation region 140 may be recessed to a predetermined depth.

As the first separation region 140 is formed, preliminary stack structures 110a may be formed to include patterned sacrificial layers 112 and patterned insulation layers 114. The patterned insulation layers 114 may be referred to as insulation patterns 116. In a plan view, the preliminary stack structures 110a may have a predetermined (e.g., linear) shape extending in the first direction D1 along the first separation region 140. The preliminary stack structures 110a may be spaced apart from each other in the second direction D2 across the first separation region 140. The vertical pillars PL1 to PL4 forming the first to fourth columns may penetrate a single line-shaped preliminary stack structure 110a.

Figure 13B:
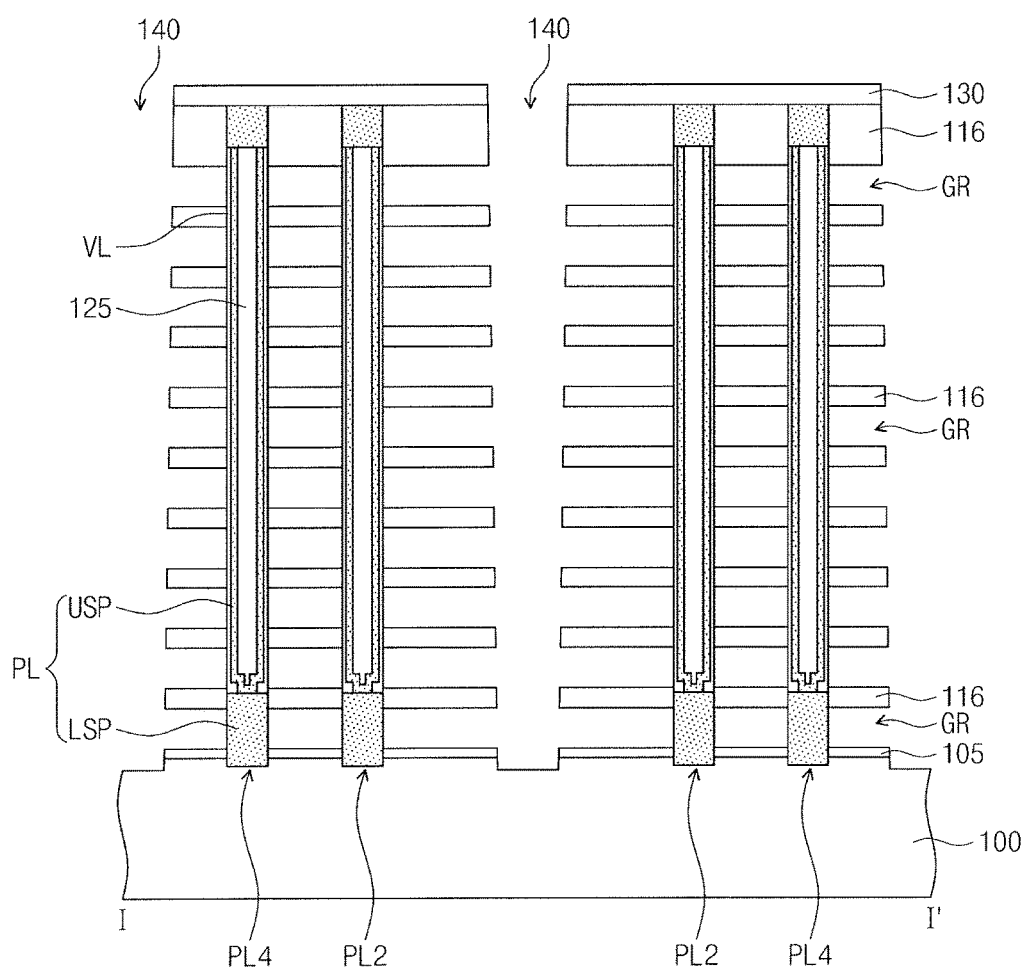

Referring to FIGS. 13A and 13B, the sacrificial layers 112 that are exposed to the first separation region 140 may be removed, so that gate regions GR may be formed between the insulation patterns 116. The gate regions GR may be formed, for example, by selectively removing the sacrificial layers 112 between the insulation patterns 116. An isotropic etching process may be used to selectively remove the sacrificial layers 112. In an embodiment, when the sacrificial layers 112 include a silicon nitride layer and the insulation patterns 116 include a silicon oxide layer, the isotropic etching process may be performed using an etchant including phosphoric acid. The gate regions GR may extend horizontally between the insulation patterns 116 from the first separation region 140, and may expose an outer sidewall of the vertical insulation layer VL. In at least one embodiment, the gate regions GR may therefore be defined by the insulation patterns 116 and their vertically adjacent outer sidewall of the vertical insulation layer VL.

Figure 14A:
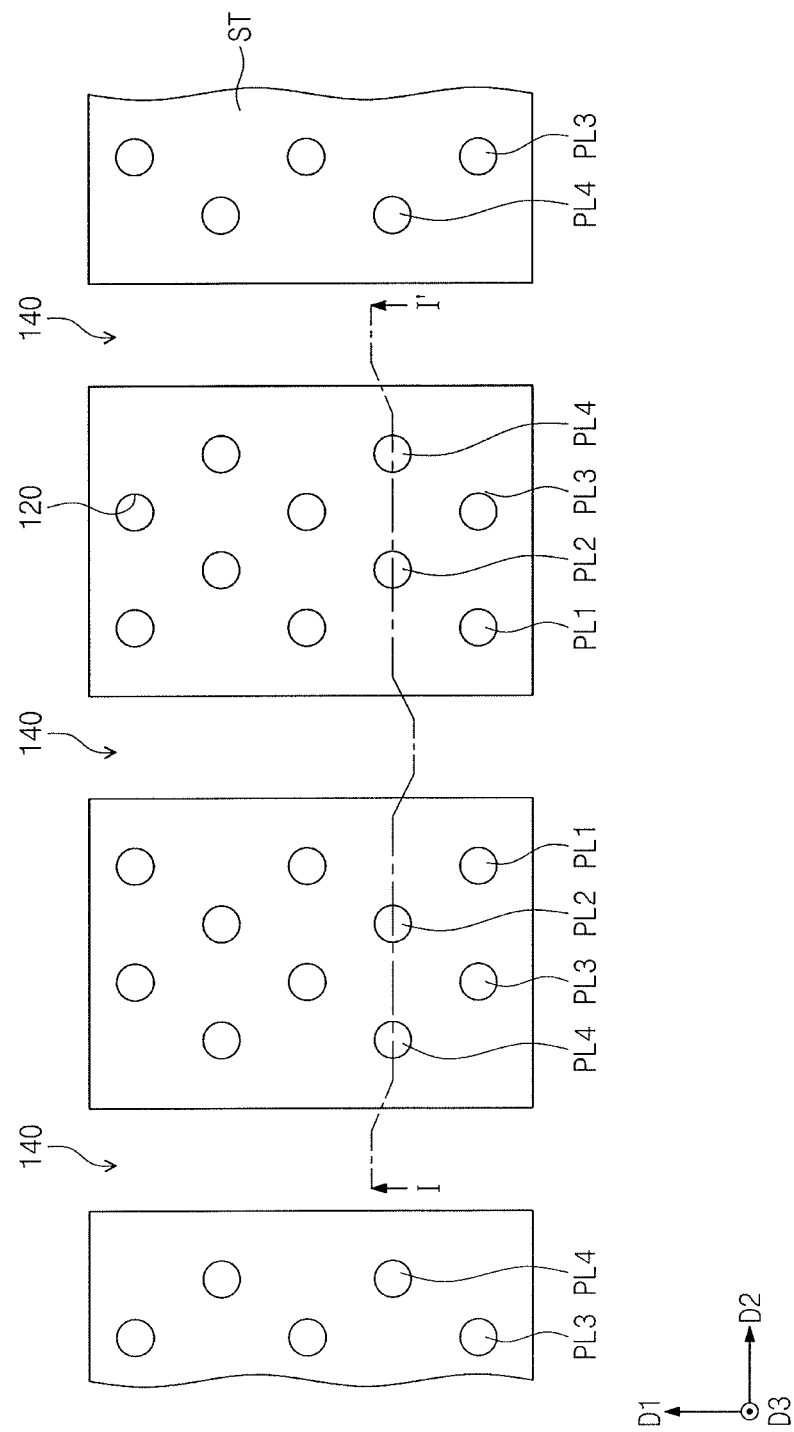
Figure 14B:
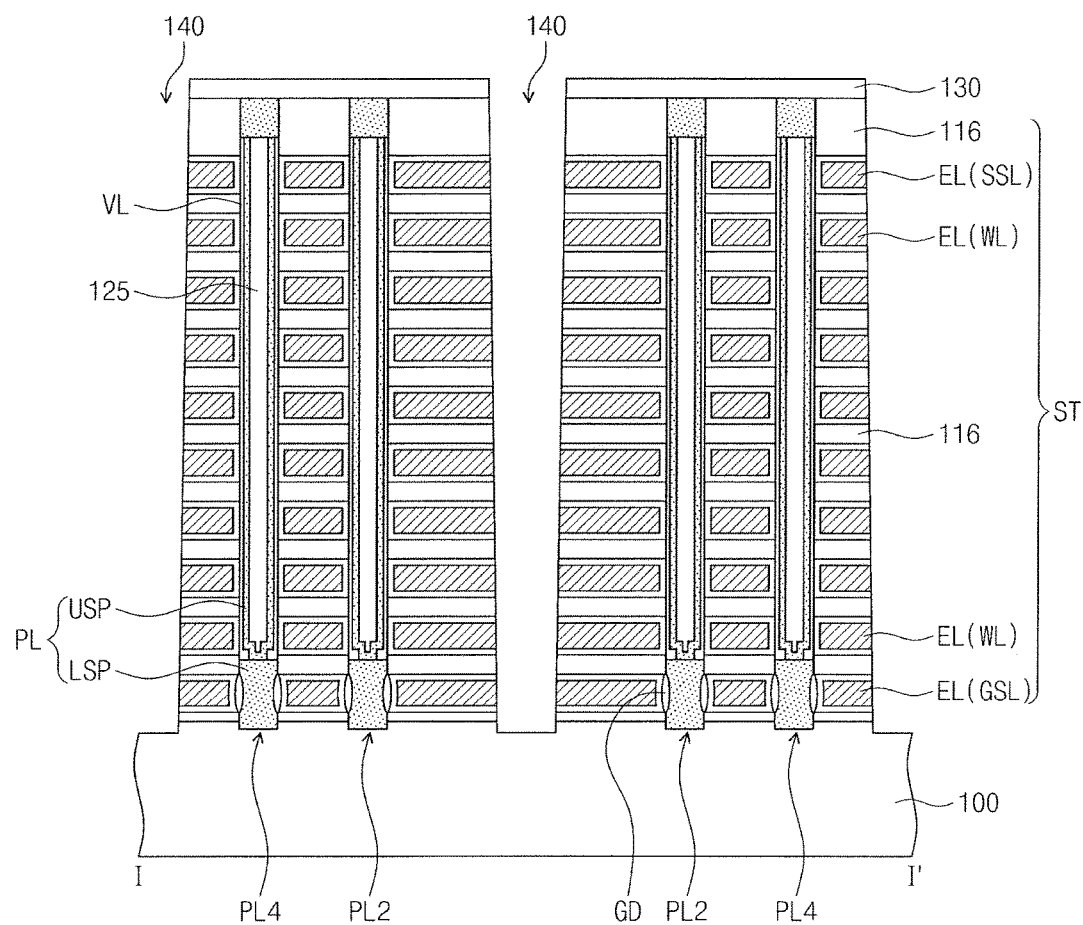

Referring to FIGS. 14A and 14B, gate electrodes EL may be formed in the gate regions GR. The gate electrodes EL may be formed, for example, by forming a conductive layer in the gate regions GR through the first separation region 140 and then partially removing the conductive layer from the first separation region 140. The conductive layer may be formed of one or more of a doped polysilicon layer, a metal layer (e.g., W), or a metal nitride layer (e.g., TiN, TaN, or WN). The conductive layer may include, for example, a metal nitride layer and a metal layer on the metal nitride layer. The conductive layer may be formed, for example, by atomic layer deposition.

In an embodiment, before the conductive layer is formed, a horizontal insulation layer HL may be formed to conformally cover inner sidewalls of the gate regions GR. The horizontal insulation layer HL may be formed, for example, of a high-k dielectric layer such as an aluminum oxide layer and/or a hafnium oxide layer.

As the gate electrodes EL are formed in the gate regions GR, stack structures ST may be formed to include the insulation patterns 116 and the gate electrodes EL that are alternately and repeatedly stacked on the substrate 100. The stack structures ST may extend in the first direction D1 and may be spaced apart from each other in the second direction D2.

Figure 15A:
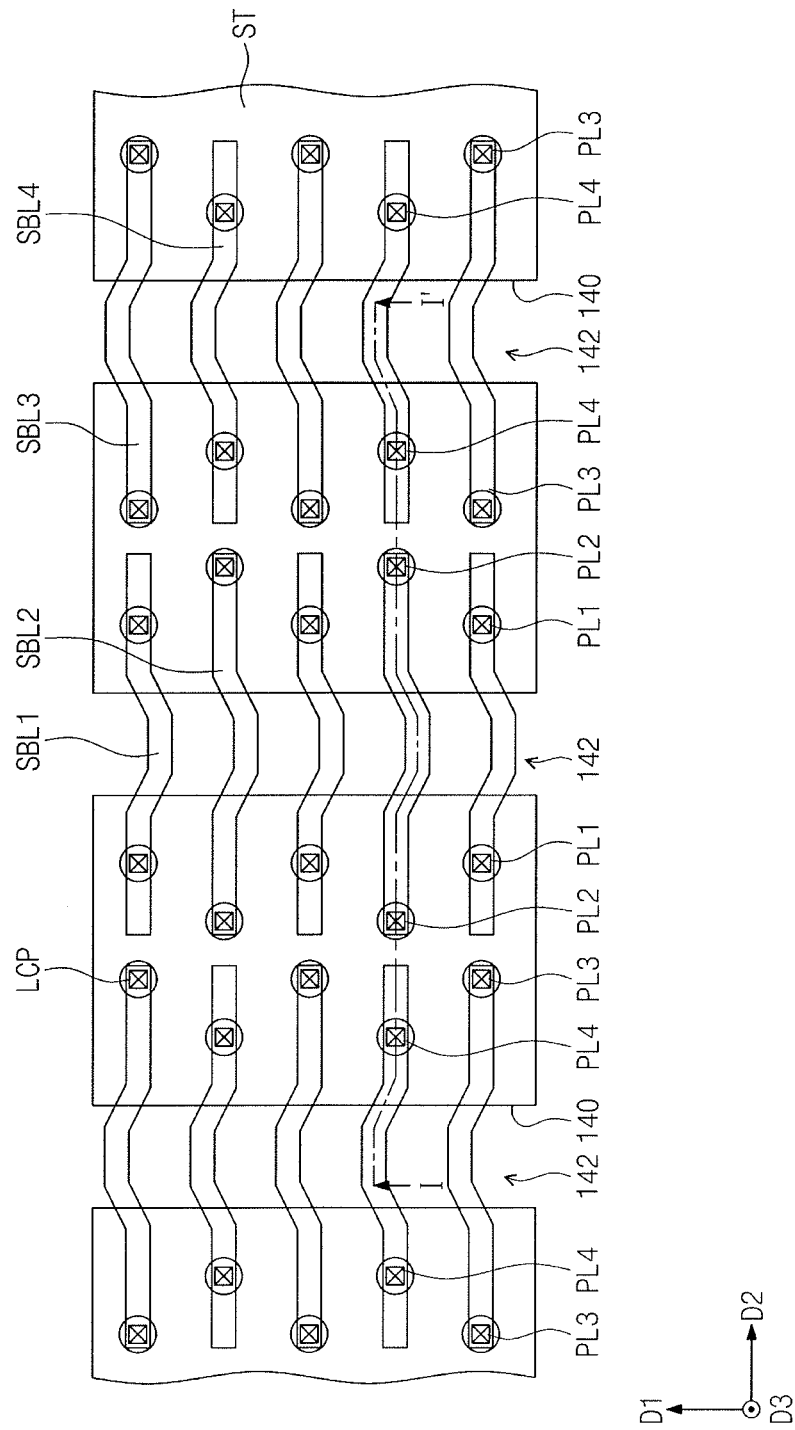
Figure 15B:
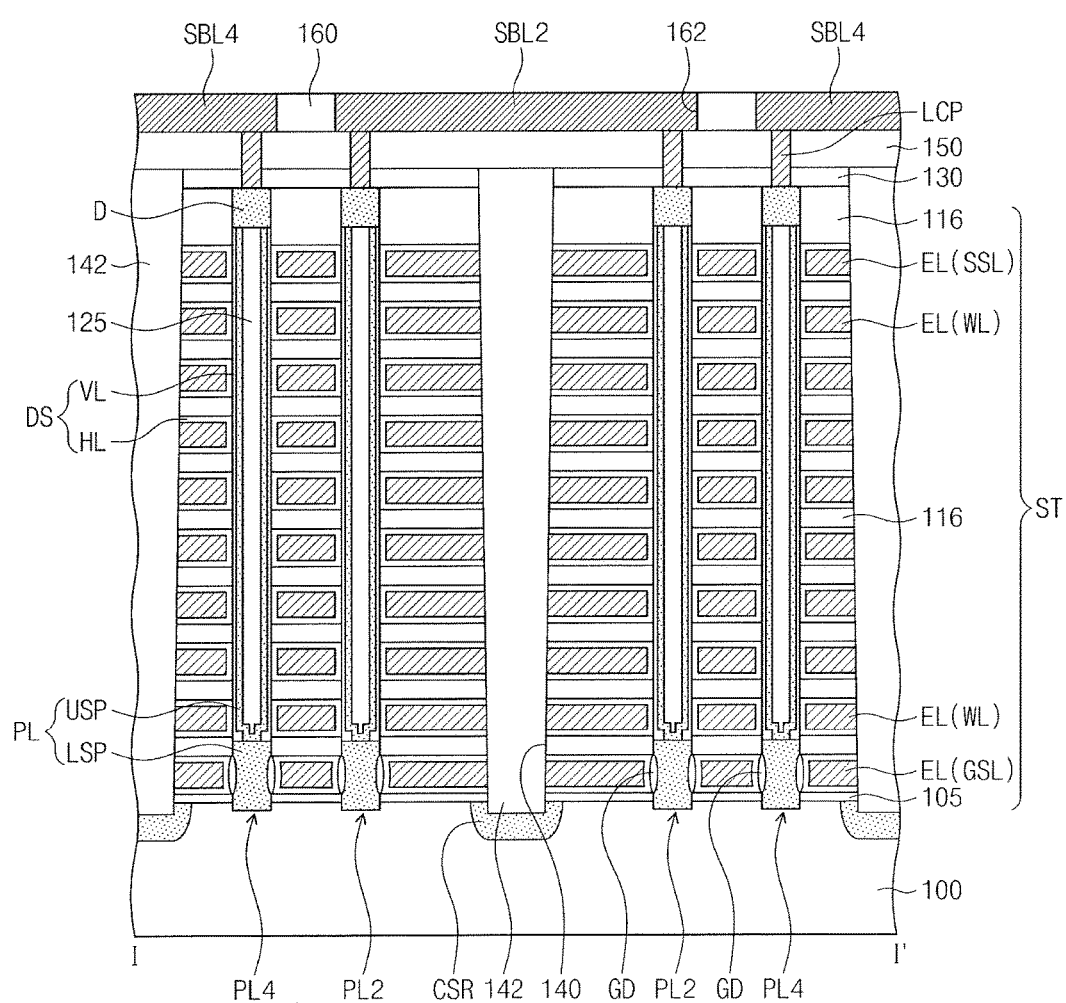
Figure 16A:
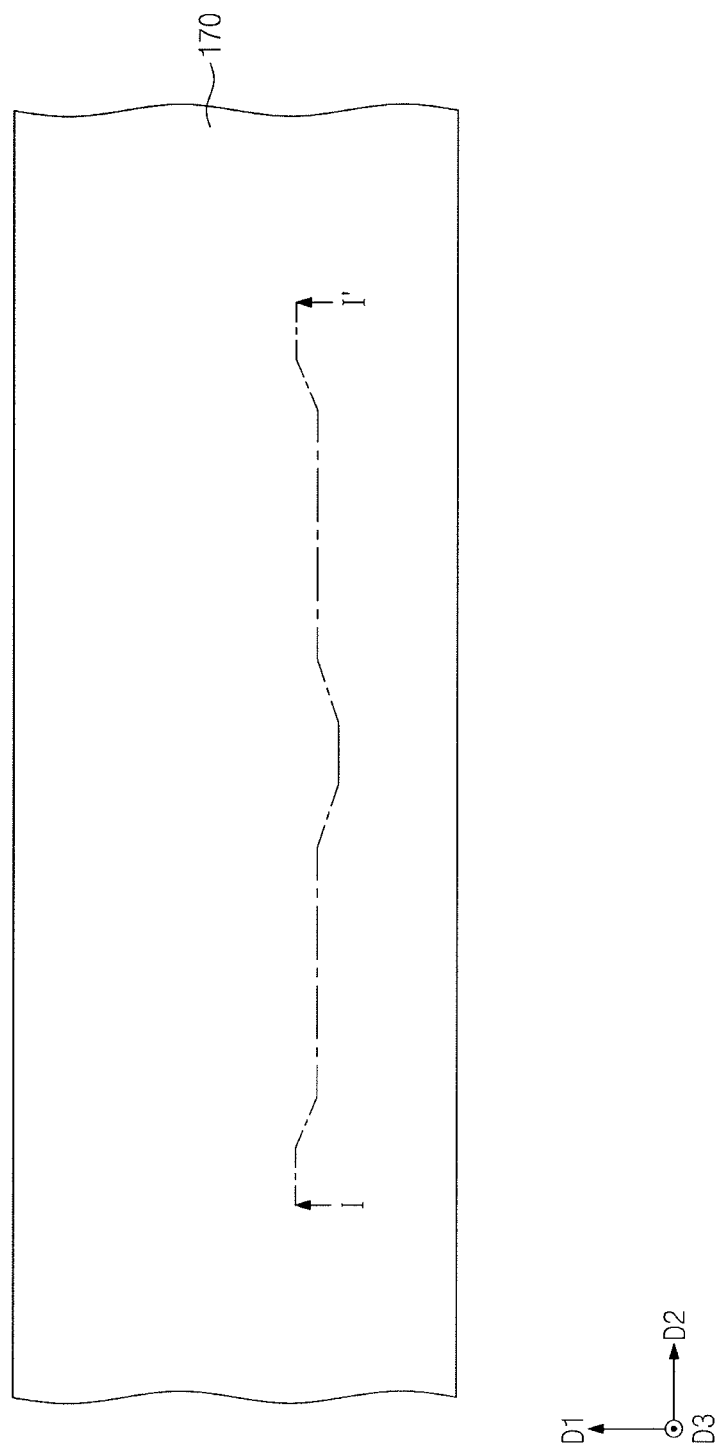
Figure 16B:
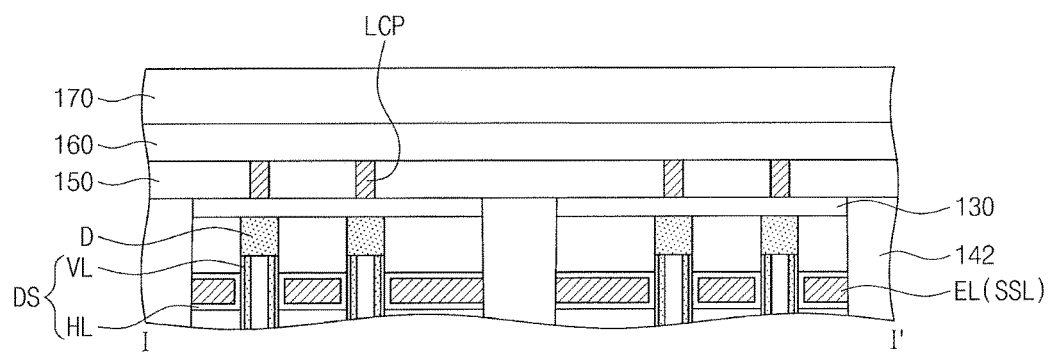

Referring to FIGS. 15A and 15B, common source regions CSR may be formed in the substrate 100 between the stack structures ST. The common source regions CSL may extend in parallel in the first direction D1 and may be disposed spaced apart from each other in the second direction D2. The common source regions CSR may be formed, for example, by doping the substrate 100 with an impurity having a conductivity different from the substrate 100.

Subsequently, a first separating insulation layer 142 may be formed in the first separating regions 140. The first separating insulation layer 142 may be formed, for example, of a silicon oxide layer. In some embodiments, as shown in FIG. 5B, the first separation region 140 may include a common source plug 144 formed to penetrate the first separating insulation layer 142 and coupled to the common source region CSR.

A first interlayer dielectric layer 150 may be formed on the stack structures ST, and lower contacts LCP coupled to the vertical pillars PL1 to PL4 may be formed in the first interlayer dielectric layer 150. For example, the lower contacts LCP may be formed by forming lower contact holes to penetrate the first interlayer dielectric layer 150 and expose the vertical pillars PL1 to PL4 and then filling the lower contact holes with a conductive material (e.g., copper).

Successively, a second interlayer dielectric layer 160 may be formed on the first interlayer dielectric layer 150, and subsidiary lines SBL1 to SBL4 may be formed in the second interlayer dielectric layer 160. The subsidiary lines SBL1 to SBL4 may connect pairs of the lower contacts LCP adjacent to each other in the second direction D2. In an embodiment, the subsidiary lines SBL1 to SBL4 may be formed by forming in the second interlayer dielectric layer 160 grooves 162 exposing pairs of the lower contacts LCP adjacent to each other in the second direction D2 and then filling the grooves 162 with a conductive material (e.g., copper).

In some embodiments, subsidiary lines (e.g., first subsidiary lines SBL1) connecting the lower contacts LCP relatively close to each other, and subsidiary lines (e.g., second subsidiary lines SBL2) connecting the lower contacts LCP relatively far away from each other may be formed to have substantially the same length and alternately disposed at a regular pitch. An embodiment of method for forming the subsidiary lines SBL1 to SBL4 is described with reference to FIGS. 16A to 20B.

FIGS. 16A to 20A are plan views illustrating an embodiment of a method for forming subsidiary lines of a semiconductor device. FIGS. 16B to 20B illustrate partial cross-sectional views taken along line I-I' in FIGS. 16A to 20A, respectively. FIG. 17C illustrates an embodiment of a photomask used for an exposure process relating to FIGS. 17A and 17B. FIG. 18C illustrates an embodiment of a photomask for an exposure process relating to FIGS. 18A and 18B. FIG. 21A view illustrates an embodiment of a photomask according to a comparative example. FIG. 21B is a plan view corresponding to FIG. 6, illustrating subsidiary lines formed using the photomask of FIG. 21A Referring to FIGS. 16A and 16B, a photoresist layer 170 may be formed on the second interlayer dielectric layer 160. For example, the photoresist layer 170 may be a negative type. Accordingly, a light-receiving portion of the photoresist layer 170 may remain without being removed by a developer. Formation of the photoresist layer 170 may include, for example, a coating and baking processes. In one embodiment, a hardmask layer and/or an antireflection layer may further be formed between the second interlayer dielectric layer 160 and the photoresist layer 170.

Figure 17A:
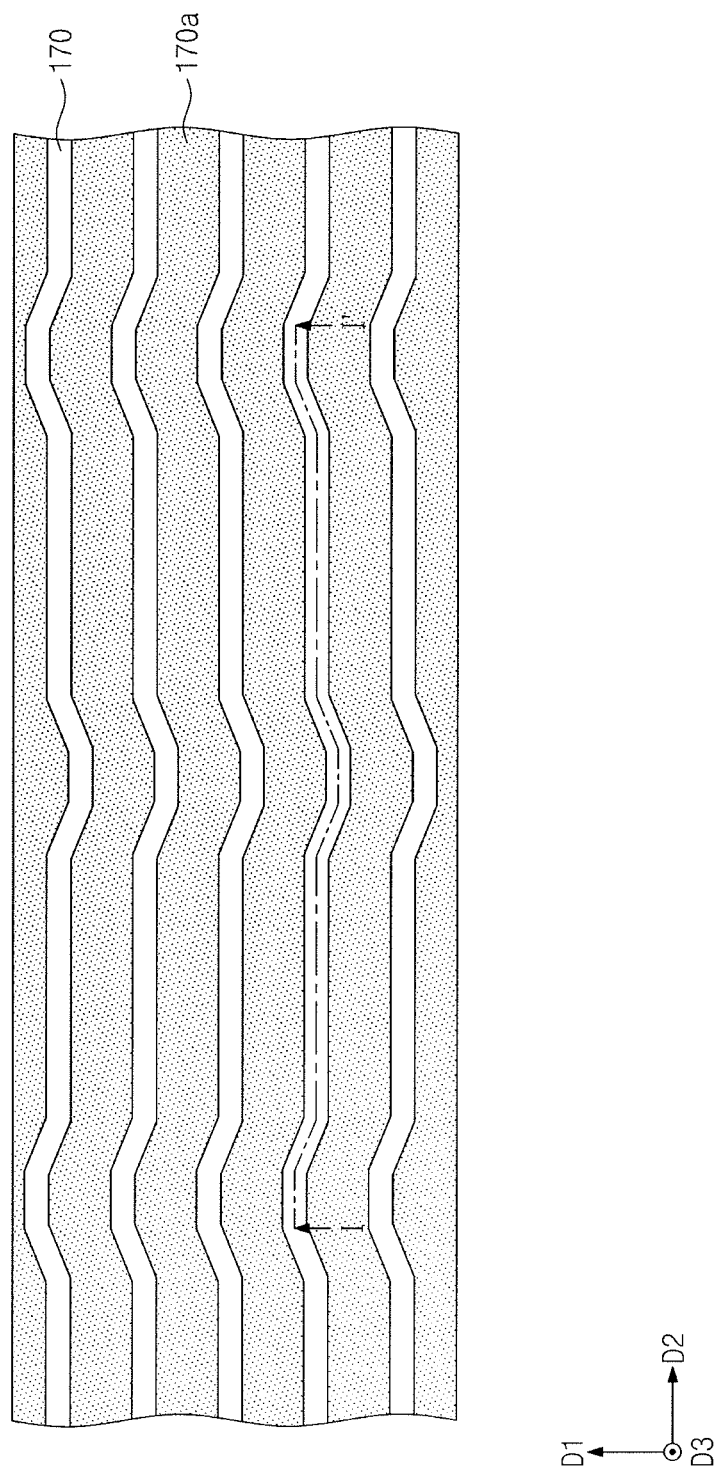
Figure 17B:
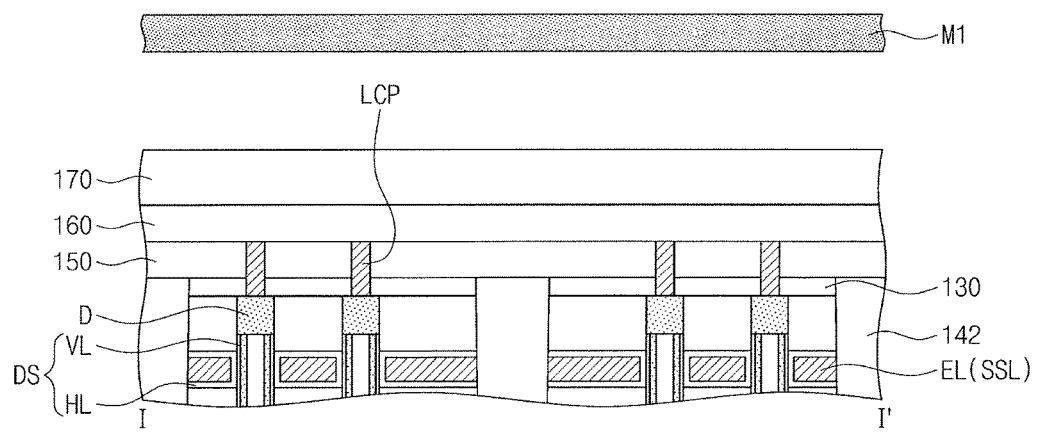
Figure 17C:
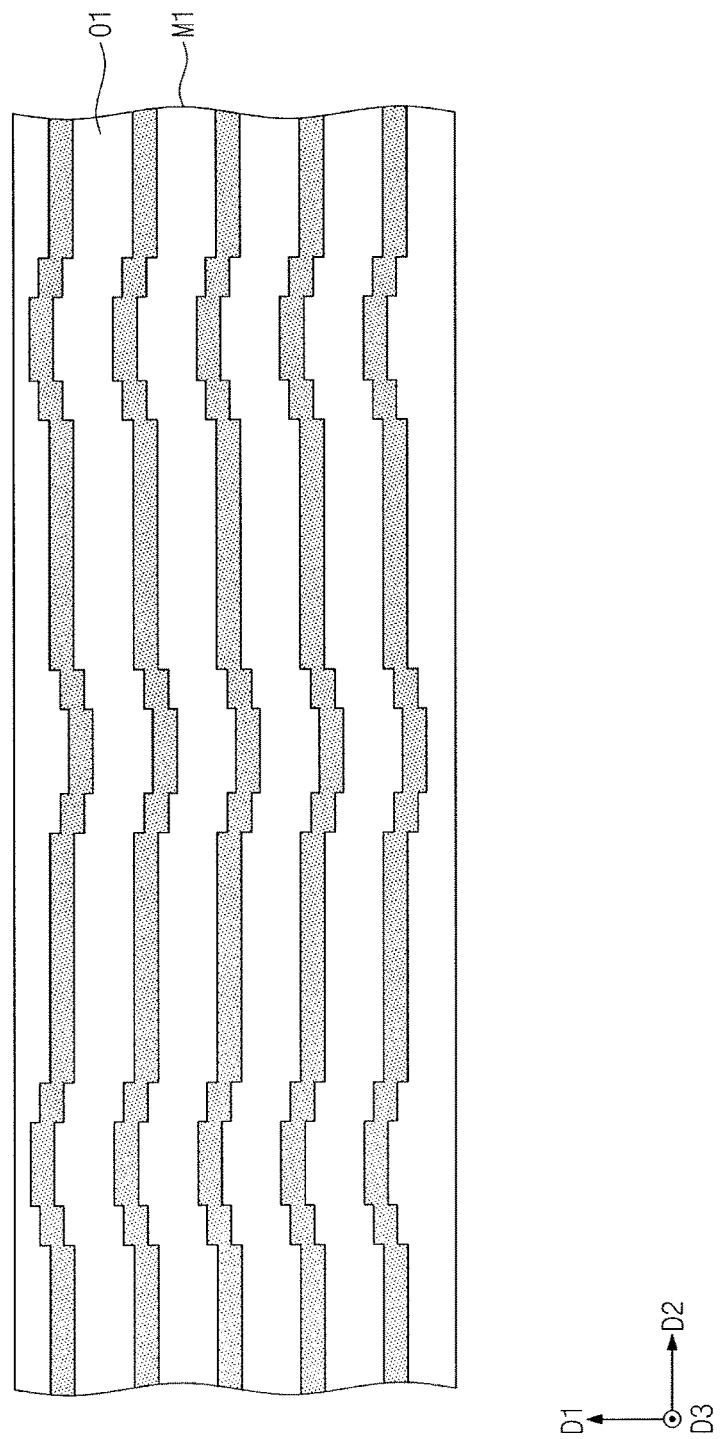
FIG. 17C illustrates an embodiment of a photomask.

Referring to FIGS. 17A to 17C, a first exposure process may be performed to partially convert the photoresist layer 170 to form first photoresist patterns 170a, which are spaced apart from each other in the first direction D1. Each of the first photoresist patterns 170a may extend in the second direction D2 and, for example, may have a periodic wave shape in plan view. A first photomask M1 may be used to perform the first exposure process. The first photomask M1 may include a light-shielding segment and first light-transmitting segments O1 spaced apart from each other. Portions of the photoresist layer 170 that receive light transmitted through the first light-transmitting segments OP1 may be converted to the first photoresist patterns 170a, which may not be removed by a developer.

Figure 18A:
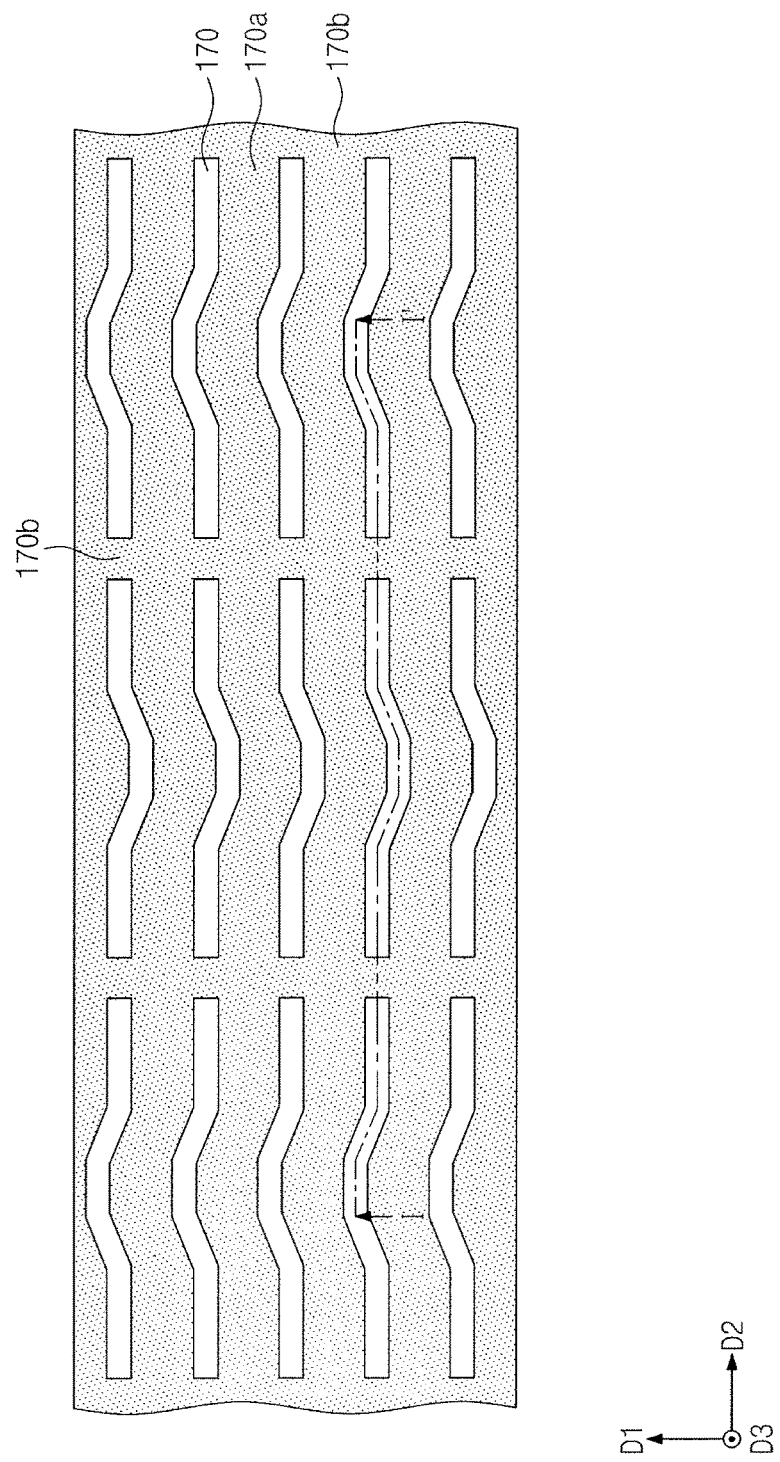
Figure 18B:
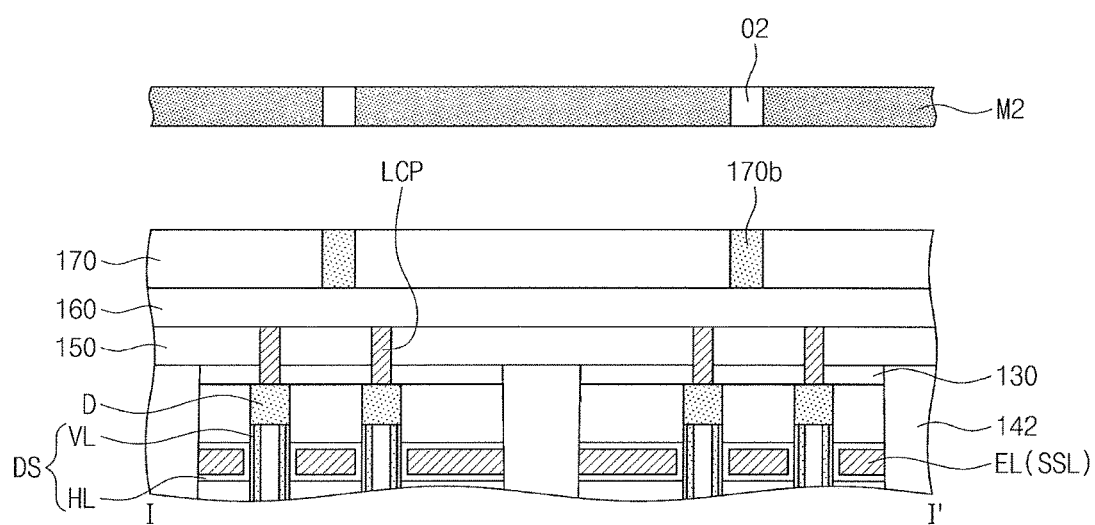
Figure 18C:
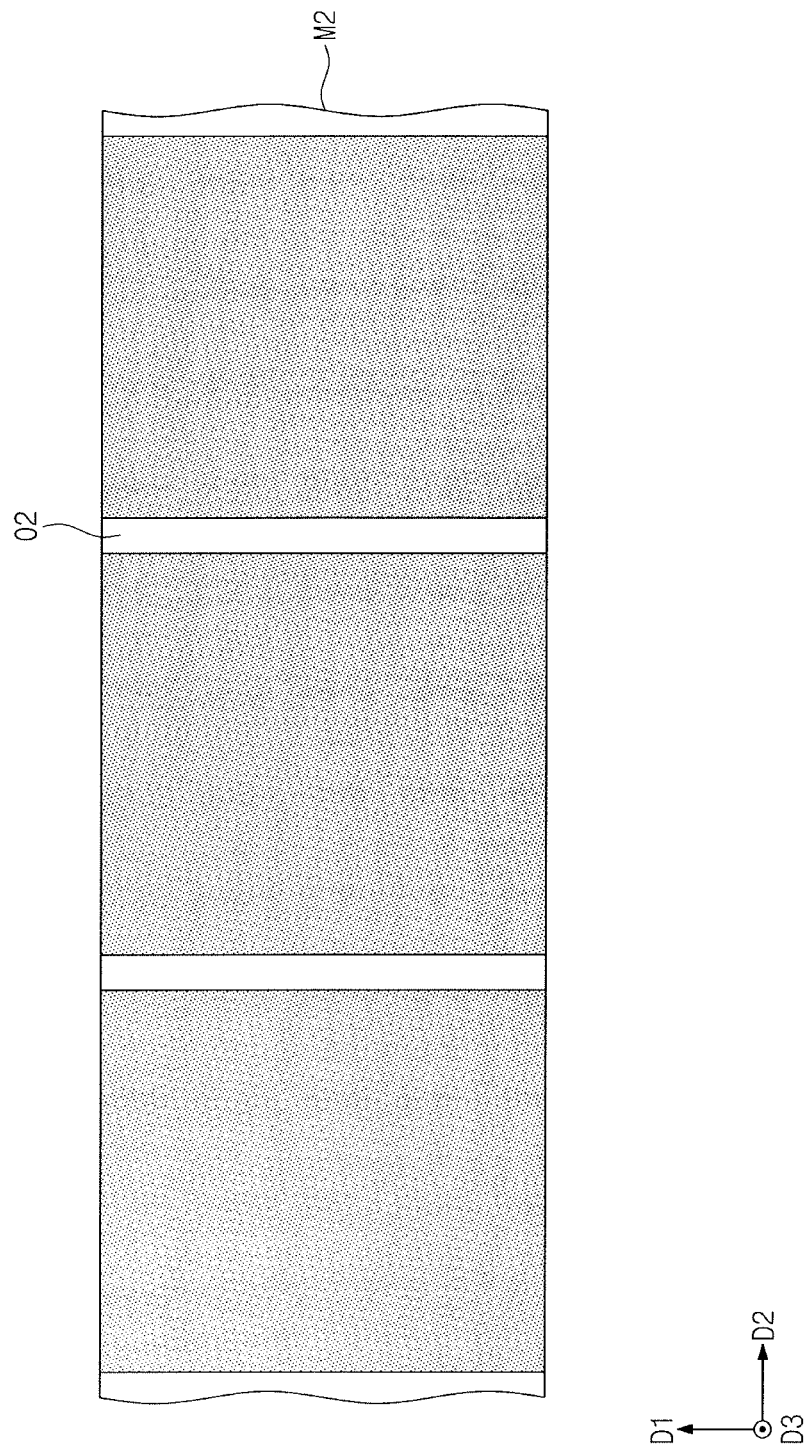
FIG. 18C illustrates another embodiment of a photomask.

Referring to FIGS. 18A and 18B, a second exposure process may be performed to convert non-converted portions (e.g., portions not exposed to light in the first exposure process) of the photoresist layer 170 to second photoresist patterns 170b, which are spaced apart from each other in the second direction D2. The second photoresist patterns 170b may have a predetermined (e.g., linear) shape running across the first photoresist patterns 170a in the first direction D1. The photoresist layer 170 may have residual portions that are not converted to the first photoresist patterns 170a in the first exposure process. The second photoresist patterns 170b may separate the residual portions in the second direction D2.

A second photomask M2 may be used to perform the second exposure process. The second photomask M2 may include a light-shielding segment and second light-transmitting segments O2 spaced apart from each other in the second direction D2. The second photomask M2 may be different from the first photomask M1. The first and second exposure processes may be performed using, for example, ArF or KrF light source or by using immersion lithography employing water for higher resolution.

Figure 19A:
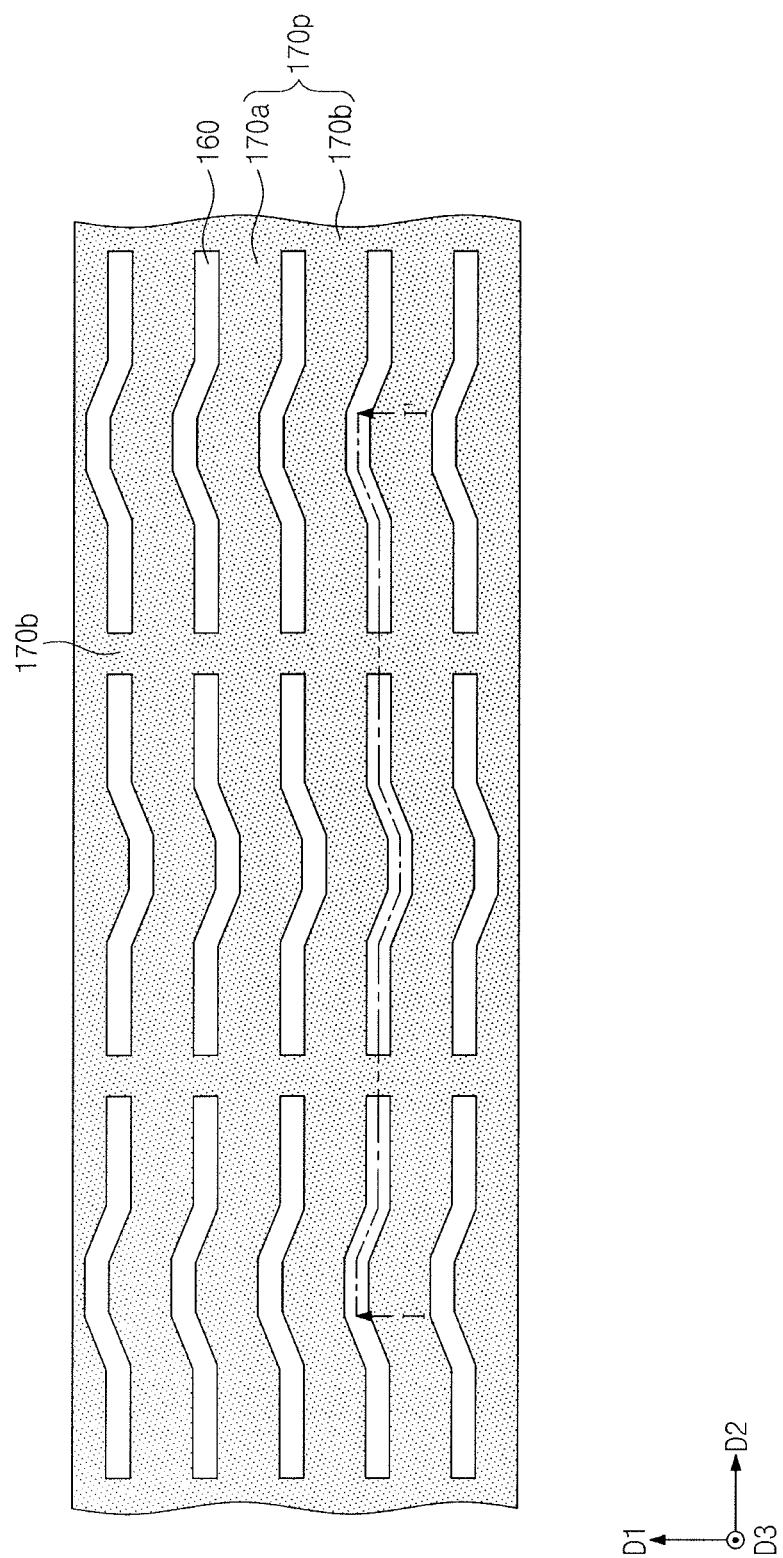
Figure 19B:
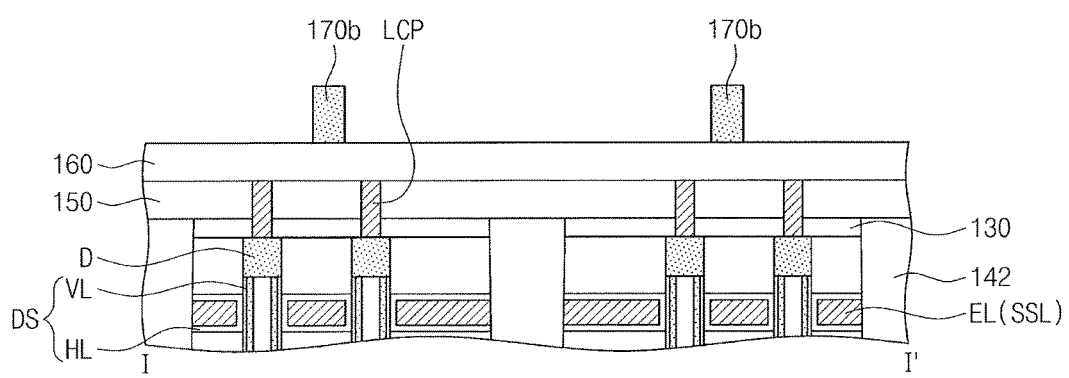

Referring to FIGS. 19A and 19B, a developer may be used to remove the photoresist layer 170 that remains without being converted to the first and second photoresist patterns 170a and 170b. As a result, a photoresist pattern 170p may be formed to expose a top surface of the second interlayer dielectric layer 160.

Figure 20B:
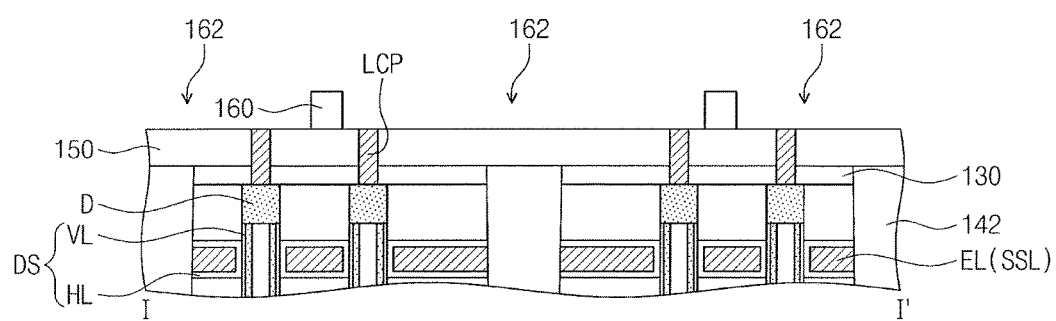
Figure 21A:
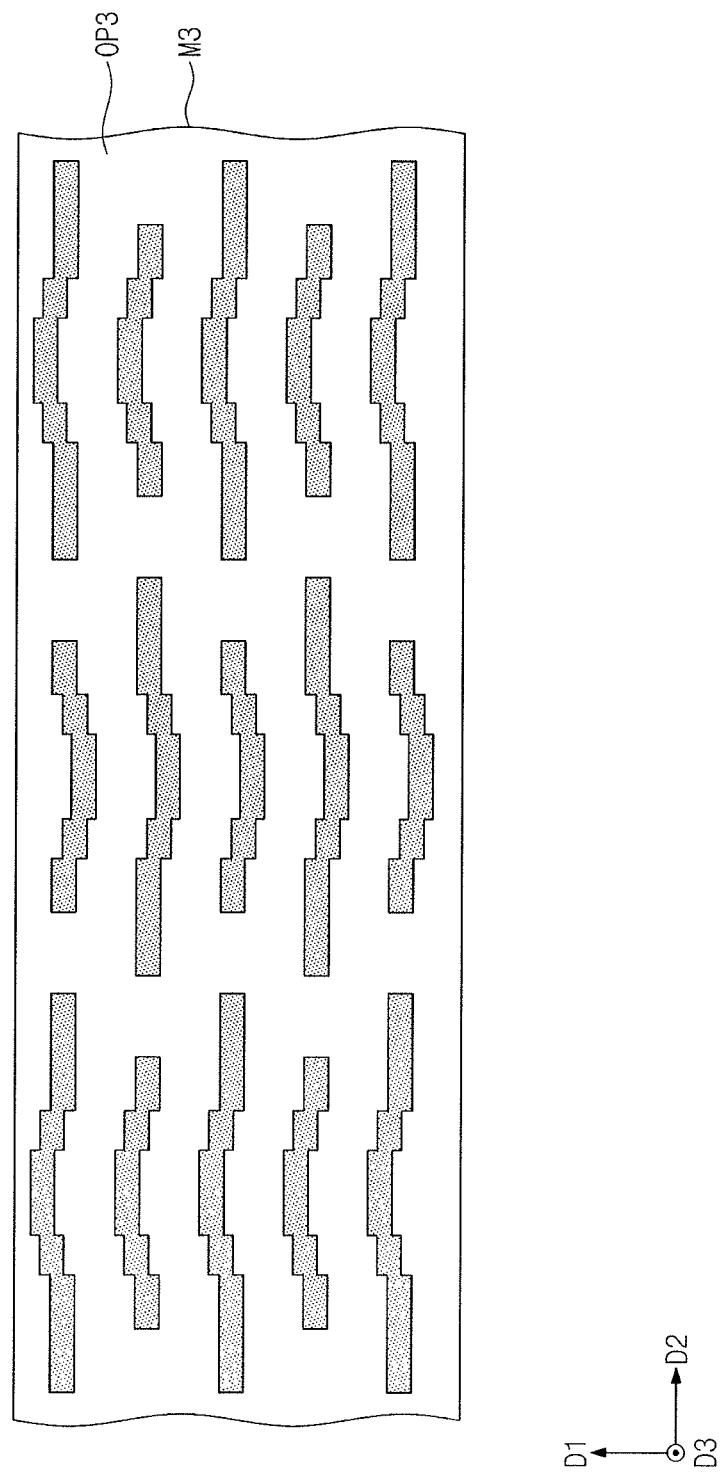
FIG. 21A illustrates a comparative example of a photomask.
Figure 21B:
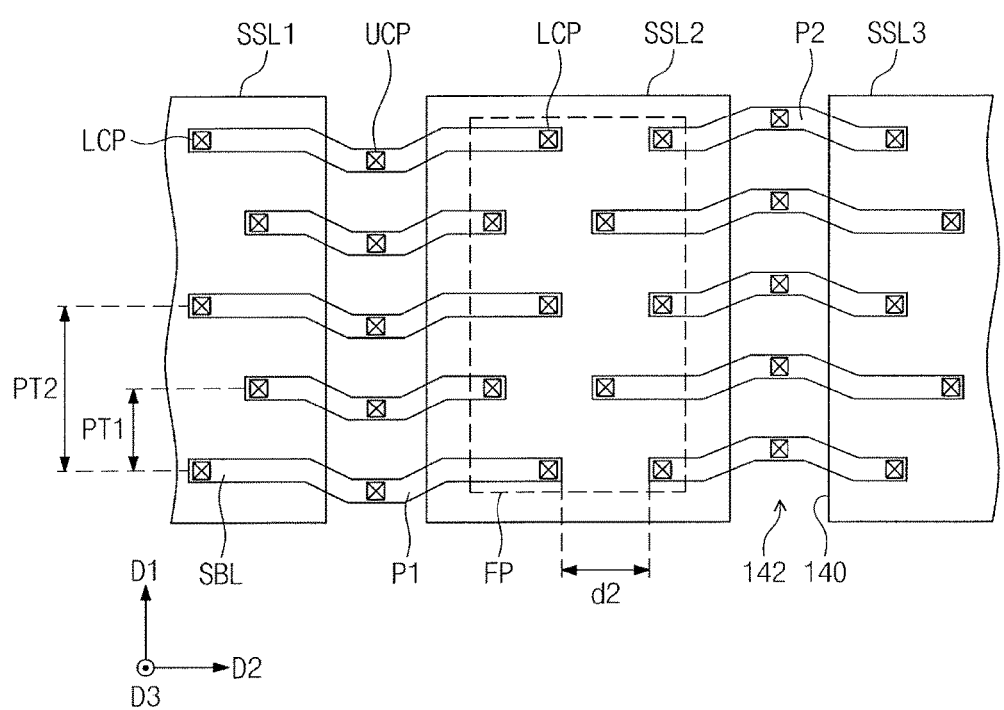
FIG. 21B illustrates an example of subsidiary lines formed using the photomask of FIG. 21A

Referring to FIGS. 20A and 20B, the photoresist pattern 170p may be used as an etching mask to etch the second interlayer dielectric layer 160. As a result, grooves 162 may be formed to commonly expose pairs of the lower contacts LCP adjacent to each other in the second direction D2. The photoresist pattern 170p may be removed when or after the grooves 162 are formed. Subsequently, the grooves 162 may be filled with a conductive material (e.g. copper) to complete formation of the subsidiary lines SBL1 to SBL4 of FIGS. 15A and 15B.

A single exposure process may be employed to form photoresist patterns for forming the grooves 162 discussed above. In this case, in order to achieve a reduced or minimum pitch between subsidiary lines, the exposure process may be performed using a third photomask M3 shown in FIG. 21A. For the third photomask M3, except for a third light-transmitting segment OP3, light-shielding segments may be elongated in the second direction D2 and may be arranged in a two-dimensional pattern along the first and second directions D1 and D2. When the third photomask M3 is used to form subsidiary lines, as shown in FIG. 21B, subsidiary lines SBL having different lengths may be alternately formed along the first direction D1.

A region FP (e.g., a forbidden pitch region) may therefore be formed with different pitches PT1 and PT2 at ends of the subsidiary lines SBL adjacent to each other in the second direction D2. A second pitch PT2 may be about twice a first pitch PT1 on the forbidden pitch region FP. In order to avoid a bridge failure between photoresist patterns caused by interference of exposure light on the forbidden pitch region FP, the subsidiary lines SBL may be formed to be spaced apart from each other in the second direction D2 at a second distance d2 greater than the first pitch PT1. For example, the first pitch PT1 may be in the range from about 70 nm to about 80 nm, and the second distance d2 may be in the range from about 100 nm to about 160 nm.

The forbidden pitch region FP may induce a decreased process margin in subsequent processes. Thus, yield may decrease in manufacturing semiconductor devices. However, according to exemplary embodiments, because the exposure process is performed twice (or multiple times) to form photoresist patterns for forming the grooves 162 discussed above, the subsidiary lines arranged along the first direction D1 may be formed to have the same length. The aforementioned forbidden pitch region FP may therefore not be formed. As a result, process margin may be enhanced and yield may also be improved in manufacturing semiconductor devices.

Referring back to FIGS. 3 and 4, the second interlayer dielectric layer 160 may be provided thereon, with a third interlayer dielectric layer 180 covering top surfaces of the subsidiary lines SBL1 to SBL4. The third interlayer dielectric layer 180 may be provided therein with upper contacts UCL formed to be coupled to the subsidiary lines SBL1 to SBL4. Next, the third interlayer dielectric layer 180 may be provided thereon with bit lines BL1 and BL2 formed to extend in the second direction D2 and coupled to the upper contacts UCL. Through the aforementioned processes, a semiconductor device of FIGS. 3 and 4 may be fabricated.

In accordance with one or more of the aforementioned embodiments, subsidiary lines connecting vertical pillars (or lower contacts) relatively close to each other and subsidiary lines connecting vertical pillars (or lower contacts) relatively far away from each other may be formed to have substantially the same length and may be alternately disposed at a regular pitch. As a result, it may be possible to enhance a process margin in subsequent processes and increase a yield in manufacturing semiconductor devices.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device, comprising:
   first and second select lines extending in a first direction on a substrate and spaced apart from each other in a second direction crossing the first direction, with a first separating insulation layer therebetween;
   a plurality of first and second vertical pillars, each of the plurality of first and second vertical pillars connected to a corresponding one of the first and second select lines, the first vertical pillars closer to the first separating insulation layer than the second vertical pillars arranged in an oblique direction from the first vertical pillars;
   first subsidiary lines, each of the first subsidiary lines electrically connecting a pair of the first vertical pillars adjacent to each other in the second direction; and
   second subsidiary lines, each of the second subsidiary lines electrically connecting a pair of the second vertical pillars adjacent to each other in the second direction, wherein
   the first and second subsidiary lines are alternately disposed along the first direction, and wherein:
   ends of the first subsidiary lines and ends of the second subsidiary lines are aligned to each other along the first direction.

2. The semiconductor device as claimed in claim 1, further comprising:
   lower contacts on each of the plurality of the first and second vertical pillars and coupled to the first and second subsidiary lines.

3. The semiconductor device as claimed in claim 2, wherein a pair of the lower contacts coupled to a respective one of the first subsidiary lines is spaced apart at an interval less than an interval between a pair of the lower contacts coupled to a respective one of the second subsidiary lines.

4. The semiconductor device as claimed in claim 1, further comprising:
   a third select line spaced apart from the second select line across a second separating insulation layer in the second direction;
   a plurality of third and fourth vertical pillars, each of the plurality of third and fourth vertical pillars connected to a corresponding one of the second and third select lines, the fourth vertical pillars closer to the second separating insulation layer and the third vertical pillars arranged in an oblique direction from the fourth vertical pillars;
   third subsidiary lines, each of the third subsidiary lines electrically connecting a pair of the third vertical pillars adjacent to each other in the second direction; and
   fourth subsidiary lines, each of the fourth subsidiary lines electrically connecting a pair of fourth vertical pillars adjacent to each other in the second direction, wherein the third and fourth subsidiary lines are alternately disposed along the first direction and wherein ends of the third subsidiary lines and ends of the fourth subsidiary lines are aligned along the first direction.

5. The semiconductor device as claimed in claim 4, wherein:
   the third subsidiary lines are spaced apart from the first subsidiary lines at a first distance in the second direction, and
   the fourth subsidiary lines are spaced apart from the second subsidiary lines at the first distance in the second direction.

6. The semiconductor device as claimed in claim 5, wherein:
   the first and second subsidiary lines are spaced apart at a first pitch equal to a second pitch between the third and fourth subsidiary lines,
   the first distance is less than the first and second pitches.

7. The semiconductor device as claimed in claim 4, further comprising:
   vertically stacked word lines between the substrate and the first to third select lines, wherein the first to fourth vertical pillars penetrate the vertically stacked word lines and are connected to the substrate.

8. The semiconductor device as claimed in claim 7, wherein each of the first and second separating insulation layers separates the vertically stacked word lines in the second direction.

9. The semiconductor device as claimed in claim 7, wherein:
- the first separating insulation layer has a bottom surface higher than a top surface of an uppermost one of the vertically stacked word lines, and
- the second separating insulation layer separates the vertically stacked word lines in the second direction.

10. The semiconductor device as claimed in claim 9, further comprising:
- dummy vertical pillars penetrating the first separating insulation layer.

11. The semiconductor device as claimed in claim 9, wherein:
- the first and second subsidiary lines have a first length, and
- the third and fourth subsidiary lines have a second length greater than the first length.

12. The semiconductor device as claimed in claim 4, wherein:
- each of the first and second subsidiary lines includes a first protrusion in the first direction and overlaps the first separating insulation layer, and
- each of the third and fourth subsidiary lines includes a second protrusion in an opposite direction to the first direction and overlaps the second separating insulation layer.

13. The semiconductor device as claimed in claim 12, further comprising:
- upper contacts, each of the upper contacts on one of the first or second protrusions;
- first bit lines connected to the first and second subsidiary lines through the upper contacts on the first protrusions; and
- second bit lines connected to the third and fourth subsidiary lines through the upper contacts on the second protrusions, wherein the first and second bit lines extend in the second direction and are alternately disposed along the first direction.

* * * * *